(12) United States Patent
Kobayakawa et al.

(10) Patent No.: US 11,876,190 B2
(45) Date of Patent: Jan. 16, 2024

(54) BATTERY PACK AND METHOD OF PROTECTING BATTERY PACK

(71) Applicant: MAKITA CORPORATION, Anjo (JP)

(72) Inventors: Tadahiko Kobayakawa, Anjo (JP); Hiroki Uesugi, Anjo (JP); Hayato Kano, Anjo (JP)

(73) Assignee: MAKITA CORPORATION, Anjo (JP)

( * ) Notice: Subject to any disclaimer, the term of this patent is extended or adjusted under 35 U.S.C. 154(b) by 500 days.

(21) Appl. No.: 17/022,193

(22) Filed: Sep. 16, 2020

(65) Prior Publication Data

US 2021/0098832 A1     Apr. 1, 2021

(30) Foreign Application Priority Data

Sep. 27, 2019 (JP) ................. 2019-177317

(51) Int. Cl.
| | |
|---|---|
| *H01M 10/42* | (2006.01) |
| *H01M 10/44* | (2006.01) |
| *H01M 10/48* | (2006.01) |
| *G01R 31/3828* | (2019.01) |

(52) U.S. Cl.
CPC ...... *H01M 10/425* (2013.01); *G01R 31/3828* (2019.01); *H01M 10/44* (2013.01); *H01M 10/486* (2013.01); *H01M 2010/4278* (2013.01)

(58) Field of Classification Search
CPC .. H01M 10/425; H01M 10/44; H01M 10/486; H01M 2010/4278; G01R 31/3828
See application file for complete search history.

(56) References Cited

U.S. PATENT DOCUMENTS

| | | |
|---|---|---|
| 2013/0027828 A1 | 1/2013 | Noda et al. |
| 2013/0033233 A1* | 2/2013 | Noda ............... H02J 9/005 |
| | | 320/135 |
| 2013/0033790 A1 | 2/2013 | Kobayakawa et al. |
| 2013/0103355 A1 | 4/2013 | Unagami et al. |

FOREIGN PATENT DOCUMENTS

| | | |
|---|---|---|
| EP | 2 562 894 A1 | 2/2013 |
| EP | 2 562 895 A1 | 2/2013 |
| JP | 2011-229318 A | 11/2011 |
| JP | 2013-222642 A | 10/2013 |
| JP | 5524694 B2 | 6/2014 |
| WO | 2012140835 A1 | 10/2012 |

OTHER PUBLICATIONS

Feb. 25, 2021 extended Search Report issued in European Patent Application No. 20197131.4.
Apr. 18, 2023 Notice of Reasons for Refusal issued in Japanese Patent Application No. 2019-177317.

* cited by examiner

*Primary Examiner* — Brian R Ohara
*Assistant Examiner* — Brent C Thomas
(74) *Attorney, Agent, or Firm* — Oliff PLC

(57) ABSTRACT

A battery pack in one aspect of the present disclosure includes a battery and a controller provided with a counter value. During discharge of the battery pack, the controller calculates an addition value in accordance with a total number of use of the battery pack under a specified condition. The controller updates the counter value by adding the addition value. The controller prohibits the discharge of the battery pack in response to the counter value reaching a protection threshold.

13 Claims, 15 Drawing Sheets

BATTERY PACK AND METHOD OF PROTECTING BATTERY PACK

CROSS-REFERENCE TO RELATED APPLICATIONS

This application claims the benefit of Japanese Patent Application No. 2019-177317 filed on Sep. 27, 2019 with the Japan Patent Office, the disclosure of which is incorporated herein by reference.

BACKGROUND

The present disclosure relates to a battery pack.

Japanese Patent No. 5524694 discloses a heating value estimating device that periodically acquires a detection value of charge/discharge current flowing through a battery, and calculates an addition/subtraction value in accordance with the acquired detection value. The device adds or subtracts the calculated addition/subtraction value to an overcurrent counter value to update it. The overcurrent counter value corresponds to a heating value of the battery. If the overcurrent counter value is equal to or more than a threshold, the device is configured to stop discharge to protect the battery.

SUMMARY

As battery packs are repeatedly used, damage is accumulated. A battery pack with relatively large accumulated damage may not be properly protected in the same way to protect a battery pack with relatively small accumulated damage.

In one aspect of the present disclosure, it is preferable to provide a battery pack that can be properly protected.

A battery pack according to one aspect of the present disclosure includes a battery and/or a controller provided with a counter value. During discharge of the battery, the controller calculates an addition value in accordance with a total number of use of the battery pack under a specified condition. During the discharge of the battery, the controller updates the counter value by adding the addition value. During the discharge of the battery, the controller prohibits the discharge of the battery in response to the counter value reaching a protection threshold.

According to the battery pack, the addition value is calculated in accordance with the total number of use of the battery pack, and the calculated addition value is added to the counter value to update the counter value. In response to the counter value reaching the protection threshold, the discharge of the battery is prohibited. The reaching time that the counter value reaches the protection threshold varies in accordance with the total number of use of the battery pack. Thus, the battery pack is properly protected in accordance with the total number of use of the battery pack.

The controller may calculate the addition value so that the addition value increases in response to the total number of use of the battery pack increasing.

The addition value is calculated so as to increase in response to the total number of use of the battery pack increasing. That means, in response to the accumulated damage of the battery increasing, the counter value rapidly reaches the protection threshold, and the discharge of the battery is prohibited. Thus, the battery pack can be properly protected in accordance with the total number of use thereof.

The controller may calculate the addition value equal to or more than zero in response to the discharge current value being equal to or more than the specified value. Also, the controller may calculate the addition value equal to or less than zero in response to the discharge current value being less than the specified value.

In response to the discharge current value being equal to or more than the specified value, an increase rate of the counter value increases in response to the accumulated damage of the battery increasing. In response to the discharge current value being less than the specified value, a decrease rate of the counter value decreases in response to the accumulated damage of the battery increasing. Thus, the battery pack can be properly protected in accordance with the total number of use thereof.

The total number of use may include a first number of operations. The first number of operations means how many times the battery pack is operated with the counter value exceeding an overload threshold. The overload threshold may be set to be smaller than the protection threshold.

In case of the counter value exceeding the overload threshold during the operation of the battery pack, damage is accumulated on the battery even if the discharge is not prohibited. The first number of operations (a total number of operations of the battery pack having the counter value exceeding the overload threshold) is used as the total number of use, whereby the battery pack can be protected in accordance with the accumulated damage on the battery.

The total number of use may include a second number of operations. The second number of operations means how many times the battery is operated with a temperature of the battery exceeding a specified temperature threshold.

In case of the temperature exceeding the temperature threshold during the operation of the battery pack, damage is accumulated on the battery even if the discharge is not prohibited. The second number of operations (a total number of operations of the battery pack having the temperature exceeding the temperature threshold) is used as the total number of use, whereby the battery pack can be protected in accordance with the accumulated damage on the battery.

During the charge of the battery, the controller may calculate a subtraction value in accordance with the total number of use. The subtraction value is less than zero. The controller may update the counter value by adding the subtraction value during the charge of the battery.

During the charge of the battery, the subtraction value is calculated and added to the counter value to update the counter value. The counter value is updated also during the charge and thus appropriately indicates the state of the battery.

The controller may calculate the subtraction value so that the subtraction value increases in response to the total number of use increasing.

Also during the charge, the decrease rate of the counter value decreases in response to the accumulated damage of the battery increasing. Thus, the battery pack can be properly protected in accordance with the total number of use thereof.

The controller may increase the total number of use during the charge of the battery in response to a loaded state of the battery satisfying a specified condition between the previous charge to this charge.

In case of the loaded state of the battery having satisfied the specified condition, the total number of use will be increased during a next charge. This is easier in processing than the case of increasing the total number of use of the battery pack during discharge, and thus, achieving reduction in processing load.

During discharge of the battery, the controller may set the protection threshold in accordance with the total number of use.

The protection threshold is set in accordance with the total number of use. The reaching time (time period required) that the counter value reaches the protection threshold varies in accordance with the total number of use. Therefore, the battery pack can be properly protected in accordance with the total number of use.

The controller may set the protection threshold so that the protection threshold decreases in response to the total number of use increasing.

The protection threshold is set so as to decrease in response to the total number of use increasing. Thus, the counter value rapidly reaches the protection threshold in response to the accumulated damage of the battery increasing, and the discharge of the battery is prohibited. Thus, the battery pack can be properly protected in accordance with the total number of use.

During discharge of the battery, the controller may set the overload threshold in accordance with the total number of use.

The overload threshold is set in accordance with the total number of use, and thus, the reaching time (time period required) that the counter value reaches the overload threshold varies in accordance with the total number of use. Thus, an increase rate of the total number of use can be varied in accordance with the total number of use.

The controller may set the overload threshold so that the overload threshold decreases in response to the total number of use increasing.

The overload threshold is set so as to decrease in response to the total number of use increasing. Thus, the counter value rapidly reaches the overload threshold in response to the accumulated damage of the battery increasing. Thus, the increase rate of the total number of use can be increased in response to the accumulated damage of the battery increasing. Thus, the battery pack can be more promptly protected.

In another aspect of the present disclosure, a battery pack includes a battery and/or a controller. The controller is configured to set a parameter threshold in accordance with a total number of use under a specified condition. The controller is configured to prohibit the discharge of the battery in response to an operation parameter of the battery reaching a parameter threshold.

According to the battery pack in this aspect of the present disclosure, the parameter threshold is set in accordance with the total number of use under a specified condition. In response to the operation parameter of the battery reaching the parameter threshold, the discharge of the battery is prohibited. Thus, the reaching time (time period required) that the operation parameter reaches the parameter threshold varies in accordance with the total number of use. In this way, the battery pack can be properly protected in accordance with the total number of use.

The operation parameter may include a temperature of the battery. The parameter threshold may include a temperature threshold. The controller may set the temperature threshold so that the temperature threshold decreases in response to the total number of use of the battery pack increasing, and/or may prohibit discharge in response to the temperature of the battery reaching the temperature threshold.

The temperature threshold is set so as to decrease in response to the total number of use increasing. In response to the temperature of the battery reaching the temperature threshold, the discharge of the battery is prohibited. Thus, the temperature of the battery rapidly reaches the temperature threshold in response to the accumulated damage of the battery increasing, and the discharge of the battery is prohibited. Thus, the battery pack can be properly protected in accordance with the total number of use.

The controller may be provided with a counter value. The operation parameter may include the counter value. The parameter threshold may include a protection threshold. The controller may calculate the addition value during the discharge of the battery pack, and/or update the counter value by adding the addition value to the counter value. In addition/alternatively, the controller may set the protection threshold so that the protection threshold decreases in response to the total number of use increasing, and/or prohibit the discharge in response to the counter value reaching the protection threshold.

The protection threshold is set so as to decrease in response to the total number of use increasing. In response to the counter value reaching the protection threshold, the discharge of the battery is prohibited. Thus, the counter value rapidly reaches the protection threshold in response to the accumulated damage of the battery increasing, and the discharge of the battery is prohibited. Thus, the battery pack can be properly protected in accordance with the total number of use.

The controller may calculate a subtraction value during the charge of the battery. The subtraction value is less than zero. In addition/alternatively, the controller may update the counter value by adding the subtraction value.

Updating the counter value during the charge allows the counter value to properly indicate a state of the battery.

In still another aspect of the present disclosure is a method of protecting a battery. The method includes: during discharge of the battery, calculating an addition value in accordance with the total number of use of the battery; during the discharge of the battery, updating the counter value by adding the addition value; and during the discharge of the battery, prohibiting the discharge of the battery in response to the counter value reaching a protection threshold. With the above method, effects exhibited in the above-described battery pack can be similarly achieved.

BRIEF DESCRIPTION OF THE DRAWINGS

Hereinafter, embodiments of the present disclosure will be described by way of example with reference to the accompanying drawings, in which.

DETAILED DESCRIPTION OF EXEMPLARY EMBODIMENTS

First Embodiment

[1-1. Configuration]

[1-1-1. Configuration of Battery Pack]

Figure 1:
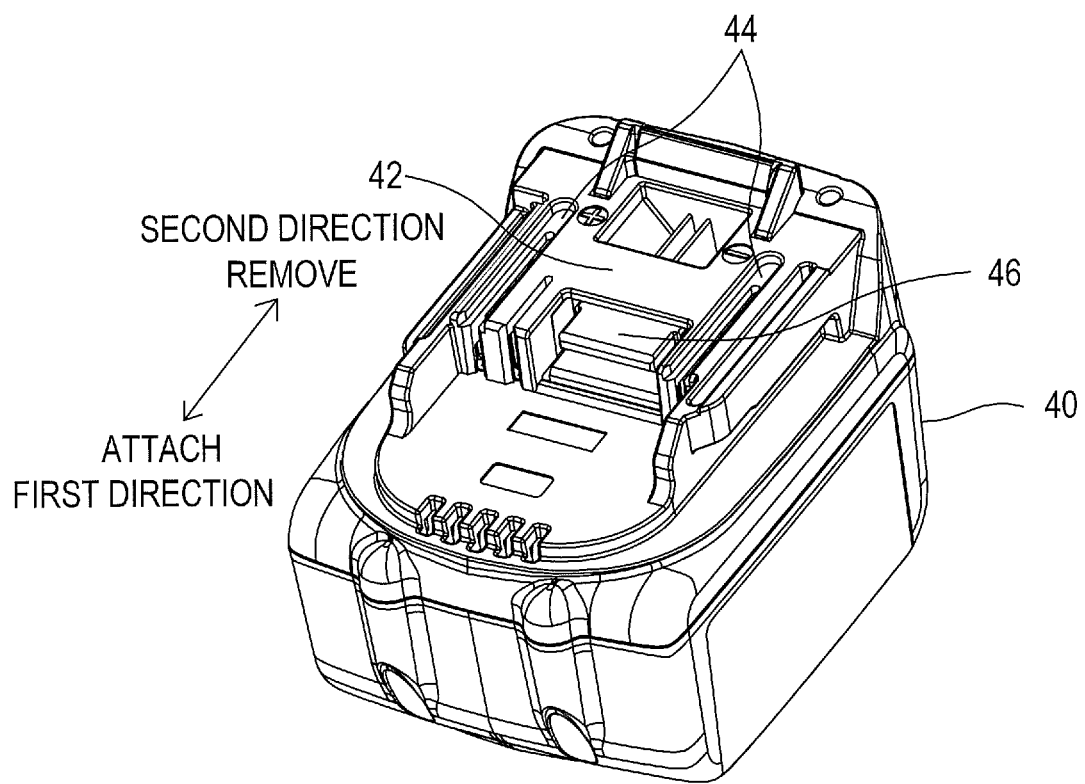
FIG. 1 is a view showing an external appearance of a battery pack according to a first embodiment.

First, the configuration of a battery pack 40 of the present embodiment will be described with reference to FIG. 1. The battery pack 40 is configured to supply electric power to a below-described electric power tool 10 when attached thereto. The battery pack 40 is configured to receive electric power from a below-described charger 80 when attached thereto.

The battery pack 40 includes a connector portion 42 to be electrically and mechanically connected to the electric power tool 10 or the charger 80. The connector portion 42 includes two power supply terminal portions 44 and a connection terminal portion 46.

The two power supply terminal portions 44 includes a first power supply terminal portion 44-1 and a second power supply terminal portion 44-2. The first power supply terminal portion 44-1 includes a groove and a positive-electrode terminal 44A provided in the groove. The groove extends in a longitudinal direction of the battery pack 40, and one of the two ends of the groove is open. The second power supply terminal portion 44-2 includes a groove similar to that of the first power supply terminal portion 44-1 and a negative-electrode terminal 44B provided in the groove. The connection terminal portion 46 includes three signal terminals 46A, 46B, 46C.

The battery pack 40 is slid in a first direction so that the plate-shaped terminals of the electric power tool 10 or the charger 80 are inserted into the two power supply terminal portions 44, and the battery pack 40 is electrically and mechanically connected to the electric power tool 10 or the charger 80. Also, the battery pack 40 is slid in a second direction to be electrically and mechanically removed from the electric power tool 10 or the charger 80. The second direction is the opposite direction of the first direction.

[1-1-2. Electrical Configuration of Battery Pack and Electric Power Tool]

Figure 2:
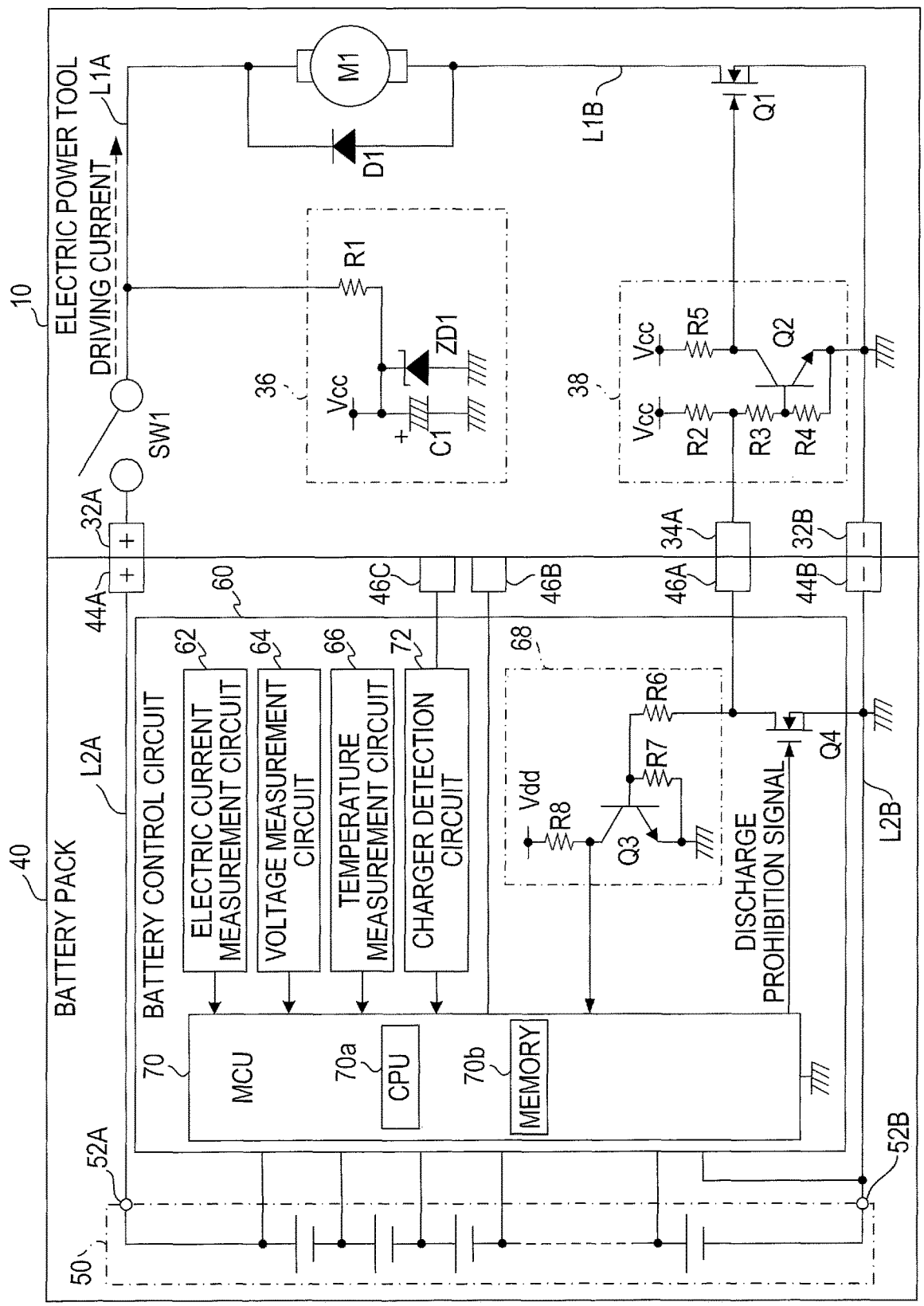
FIG. 2 is a diagram showing an electrical configuration of the battery pack and an electric power tool according to the first embodiment.

Next, the electrical configuration of the battery pack 40 and the electric power tool 10 will be described with reference to FIG. 2. Examples of the electric power tool 10 may include an impact driver, a hammer drill, and a grinder. In the present embodiment, the electric power tool 10 will be described as a connected device receiving electric power from the battery pack 40; however, this is not limited to the electric power tool 10 and other device may be used, such as, a gardening tool such as a grass cutter, a hedge trimmer, and a blower, or a laser marking device or a light.

The battery pack 40 includes a battery 50, a battery control circuit 60, the positive-electrode terminal 44A, the negative-electrode terminal 44B, and three signal terminals 46A, 46B, 46C.

The battery 50 includes two or more battery cells connected in series. The battery 50 is, for example, a lithium iron rechargeable battery. The battery 50 includes a positive electrode 52A connected to the positive-electrode terminal 44A via a positive side power-supply line L2A. The battery 50 includes a negative electrode 52B connected to the negative-electrode terminal 44B via a negative side power-supply line L2B.

The battery control circuit 60 includes an electric current measurement circuit 62, a voltage measurement circuit 64, a temperature measurement circuit 66, a switch operation detection circuit 68, a charger detection circuit 72, a Main Control Unit (MCU) 70, and a transistor Q4.

The electric current measurement circuit 62 detects an electric current flowing through the positive side power-supply line L2A or the negative side power-supply line L2B, and outputs a current detection signal corresponding to the detected electric current to the MCU 70.

The voltage measurement circuit 64 consecutively measures the voltage of each battery cell included in the battery 50, and outputs a voltage detection signal corresponding to the measured voltage to the MCU 70.

The temperature measurement circuit 66 includes thermistor arranged around the battery 50. The temperature measurement circuit 66 measures a temperature of the battery 50 (hereinafter, also referred to as a battery temperature) via the thermistor, and outputs a temperature-detection signal corresponding to the measured temperature to the MCU 70.

The transistor Q4 includes an N-channel metal-oxide-semiconductor field-effect transistor (MOSFET). The transistor Q4 includes a source terminal connected to a ground, and a gate terminal connected to the MCU 70. The transistor Q4 includes a drain terminal connected to a switch operation detection circuit 68 and the signal terminal 46A. The MCU 70 mainly outputs a high-level signal to the transistor Q4, and the transistor Q4 is ON. In response to the MCU 70 outputting a discharge prohibition signal to the transistor Q4, the transistor Q4 is turned OFF. The discharge prohibition signal corresponds to a low-level signal.

The switch operation detection circuit 68 includes a transistor Q3 and resistors R6, R7, R8, and detects that a trigger switch of the electric power tool 10 is switched from OFF to ON.

The transistor Q3 includes an NPN bipolar transistor. The transistor Q3 includes a base terminal connected to a first end of the resistor R6 and a first end of the resistor R7. The resistor R6 includes a second end connected to a drain terminal of the transistor Q4. A connection point of the resistor R6 and the transistor Q4 is connected to the signal terminal 46A.

A second end of the resistor R7 and an emitter terminal of the transistor Q3 is connected to a ground of the battery pack 40.

A first end of the resistor R8 is connected to a power source Vdd (for example, direct-current 5V), and a second end of the resistor R8 is connected to a collector terminal of the transistor Q3. A connection point of the resistor R8 and the transistor Q3 is connected to the MCU 70.

The ground of the battery pack 40 is connected to the negative side power-supply line L2B. Thus, when the battery pack 40 is attached to the electric power tool 10, the potential of the ground of the battery pack 40 is equal to the potential of the ground of the electric power tool 10, and the potential of each ground is equal to the potential of the negative electrode of the battery 50.

The charger detection circuit 72 is configured to output a detection signal to the MCU 70 indicating that the charger 80 is connected in response to the signal terminal 46C receiving a high-level signal from the charger 80. The charger detection circuit 72 is configured similarly to the switch operation detection circuit 68.

The MCU 70 includes a CPU 70a and a memory 70b. The memory 70b includes a non-volatile memory and a volatile memory. The CPU 70a executes various processing in accordance with programs stored in the memory 70b.

When the battery pack 40 is not connected to the electric power tool 10 or the charger 80, the MCU 70 enters a sleep state to reduce power consumption. In the sleep state, the MCU 70 outputs the discharge prohibition signal. The MCU 70 wakes up upon detection of the battery pack 40 being connected to the electric power tool 10 or the charger 80, and determines whether the battery pack 40 is in a dischargeable state. The MCU 70 stops the output of the discharge prohibition signal in the case of determining that the battery pack 40 is in the dischargeable state, and outputs the discharge prohibition signal in the case of determining that the battery pack 40 is in a non-dischargeable state.

The electric power tool 10 includes a motor M1, a drive switch SW1, a power-supply circuit 36, an input/output circuit 38, a transistor Q1, a working machine positive-electrode terminal 32A, a working machine negative-electrode terminal 32B, and a working machine signal terminal 34A.

The working machine positive-electrode terminal 32A is configured to be connected to the positive-electrode terminal 44A, and the working machine negative-electrode terminal 32B is configured to be connected to the negative-electrode terminal 44B. The working machine signal terminal 34A is configured to be connected to the signal terminal 46A.

The drive switch SW1 is provided on a positive side power-supply line L1A connected to the working machine positive-electrode terminal 32A. The drive switch SW1 is configured to be turned ON when the trigger switch of the electric power tool 10 is pulled (turned ON), and configured to be turned OFF when the trigger switch is released (turned OFF).

The transistor Q1 includes an N-channel MOFSET. The transistor Q1 is provided on a negative side power-supply line L1B connected to the working machine negative-electrode terminal 32B. A source terminal of the transistor Q1 is connected to the working machine negative-electrode terminal 32B, a drain terminal of the transistor Q1 is connected to a negative electrode of the motor M1. A gate terminal of the transistor Q1 is connected to the input/output circuit 38.

The motor M1 is a brushed direct current motor. The motor M1 includes a positive electrode connected to the working machine positive-electrode terminal 32A via the positive side power-supply line L1A and the drive switch SW1. The motor M1 includes a negative electrode connected to the working machine negative-electrode terminal 32B via the negative side power-supply line L1B and the transistor Q1.

Between the positive electrode and the negative electrode of the motor M1, a diode D1 is connected. The diode D1 includes a cathode terminal connected to the positive electrode of the motor M1. The diode D1 includes an anode terminal connected to the negative electrode of the motor M1. The diode D1 corresponds to so-called a flywheel diode.

The power-supply circuit 36 includes a Zener diode ZD1, a capacitor C1, and a resistor R1. The power-supply circuit 36 is configured to generate a power-supply voltage for driving internal circuits of the electric power tool 10. The Zener diode ZD1 includes a cathode connected to the positive side power-supply line L1A via the resistor R1. The Zener diode ZD1 includes an anode connected to a ground of the electric power tool 10.

The capacitor C1 is an electrolytic capacitor. The capacitor C1 includes a positive electrode connected to the positive side power-supply line L1A together with the cathode of the Zener diode ZD1 via the resistor R1. The capacitor C1 includes a negative electrode connected to the ground of the electric power tool 10.

The input/output circuit 38 includes a transistor Q2 and resistors R2, R3, R4, R5. The transistor Q2 includes the NPN bipolar transistor. The resistor R2 includes a first end connected to a power source Vcc. The resistor R2 includes a second end connected to a first end of the resistor R3. A connection point of the resistor R2 and the resistor R3 is connected to the working machine signal terminal 34A.

The resistor R3a second end connected to a first end of the resistor R4. A connection point of the resistor R3 and the resistor R4 is connected to a base terminal of the transistor Q2. The second end of the resistor R4 and an emitter terminal of the transistor Q2 are connected to a ground.

the resistor R5 includes a first end connected to a power source Vcc. The resistor R5 includes a second end connected to a collector terminal of the transistor Q2. A connection point of the resistor R5 and the transistor Q2 is connected to a gate terminal of the transistor Q1.

When the battery pack 40 is attached to the electric power tool 10 and the trigger switch is pulled, the drive switch SW1 is switched ON from OFF. This connects the positive side power-supply line L1A to the positive side power-supply line L2A of the battery pack 40 via the working machine positive-electrode terminal 32A.

Thus, in the power-supply circuit 36, a battery voltage is applied from the positive side power-supply line L1A to the cathode of the Zener diode ZD1 via the resistor R1. The applied battery voltage is stepped down with the Zener diode ZD1 to a specified direct voltage (for example, 5V). Then, the capacitor C1 is configured to be charged with the step-down direct voltage. A voltage across the capacitor C1 is supplied to the various internal circuits in the electric power tool 10 and serves as a power-supply voltage Vcc to operate the circuits.

When the drive switch SW1 is switched ON, the transistor Q4 is in an OFF state. Thus, when the drive switch SW1 is switched ON, a high-level signal, which corresponds to the power-supply voltage Vcc in the electric power tool 10, is inputted from the working machine signal terminal 34A to the signal terminal 46A. Then, the transistor Q3 is turned ON, and an input signal from the switch operation detection circuit 68 to the MCU 70 is changed from a high-level signal to a low-level signal. In response to the input signal from the switch operation detection circuit 68 being changed to the low-level signal, the MCU 70 detects that the electric power tool 10 is connected, and wakes up from the sleep state.

When the MCU 70 stops the output of the discharge prohibition signal and the transistor Q4 is switched ON, the working machine signal terminal 34A is connected to the ground, and the transistor Q2 is switched OFF. As a result, the power-supply voltage Vcc is applied to the gate terminal of the transistor Q1, and the transistor Q1 is switched ON. On the other hand, when the MCU 70 outputs the discharge prohibition signal and the transistor Q4 is switched OFF, an electric current flows into the base terminal of the transistor Q2, and the transistor Q2 is switched ON. As a result, the gate terminal of the transistor Q1 is connected to the ground, and thus, the transistor Q1 is switched OFF.

Thus, in the case where the drive switch SW1 is ON with the trigger switch pulled and the MCU 70 stops the output of the discharge prohibition signal, the transistor Q1 turns ON. As a result, the motor M1 is driven with the electric power supplied from the battery pack 40.

[1-1-3. Electrical Configuration of Battery Pack and Charger]

Figure 3:
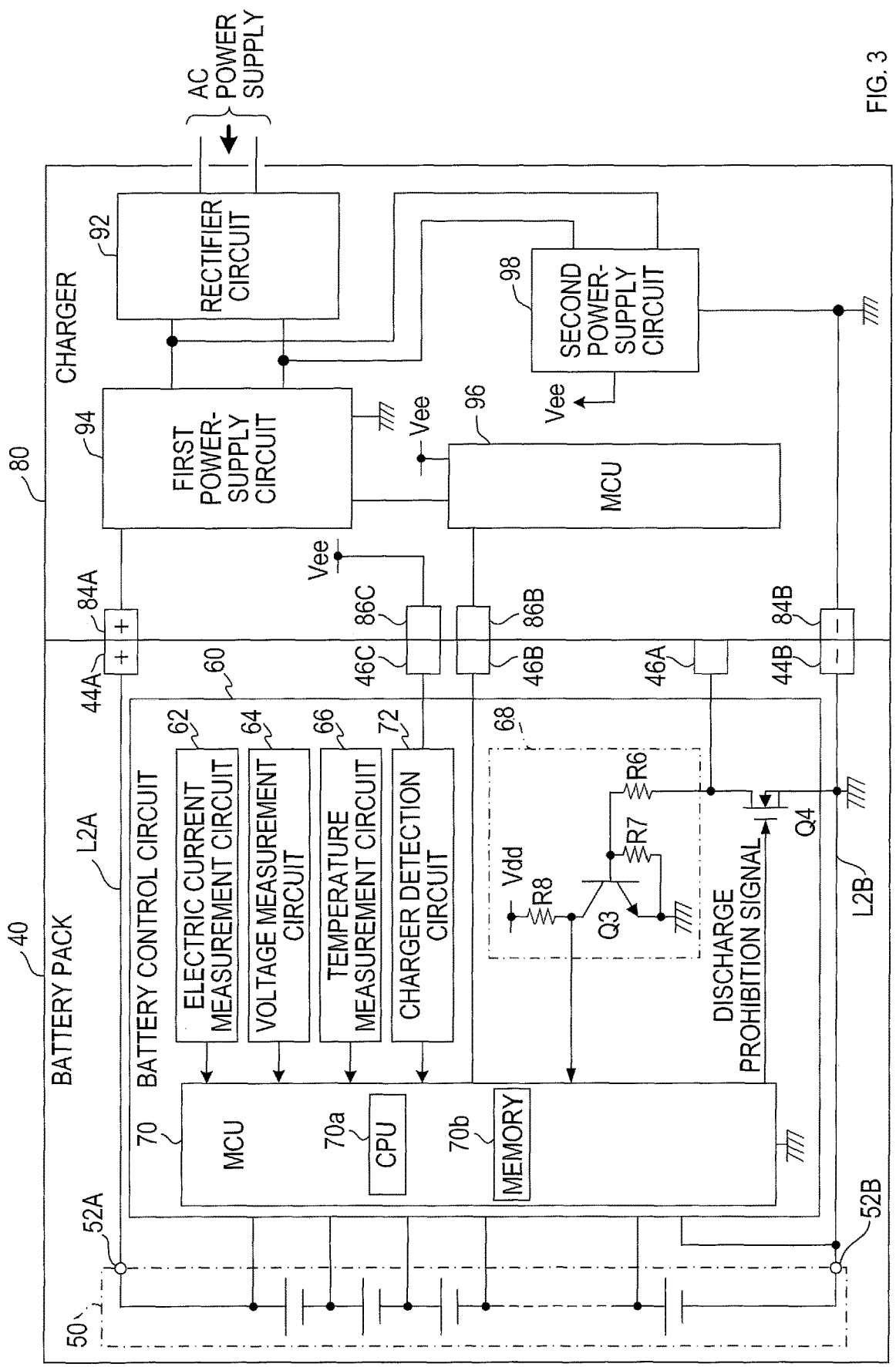
FIG. 3 is a diagram showing an electrical configuration of the battery pack and a charger according to the first embodiment.
Figure 4A:
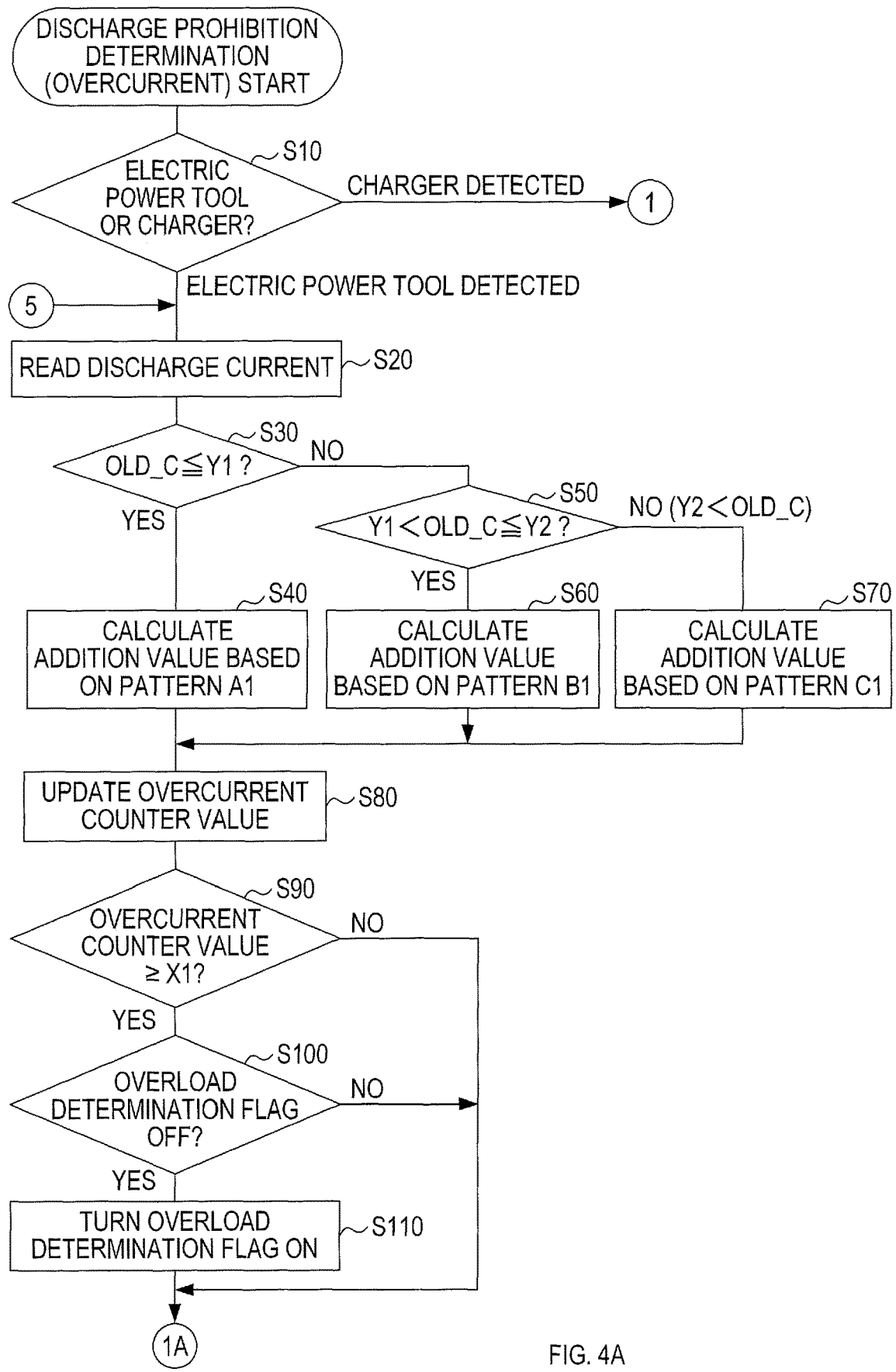
FIG. 4A is a part of a flowchart showing a discharge prohibition determination process in accordance with an overcurrent according to the first embodiment.
Figure 4B:
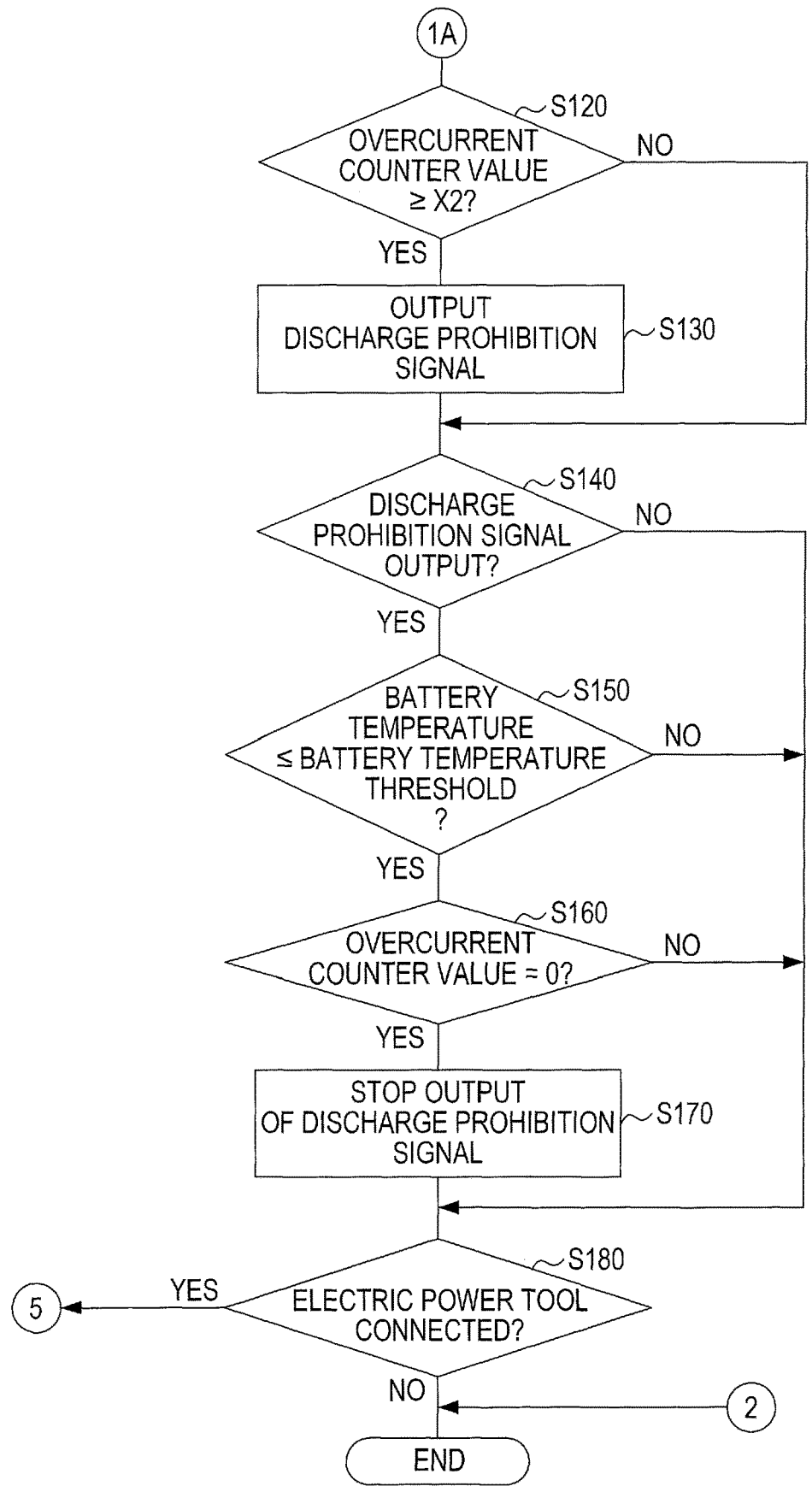
FIG. 4B is another part of the flowchart showing the discharge prohibition determination process in accordance with the overcurrent according to the first embodiment.
Figure 4C:
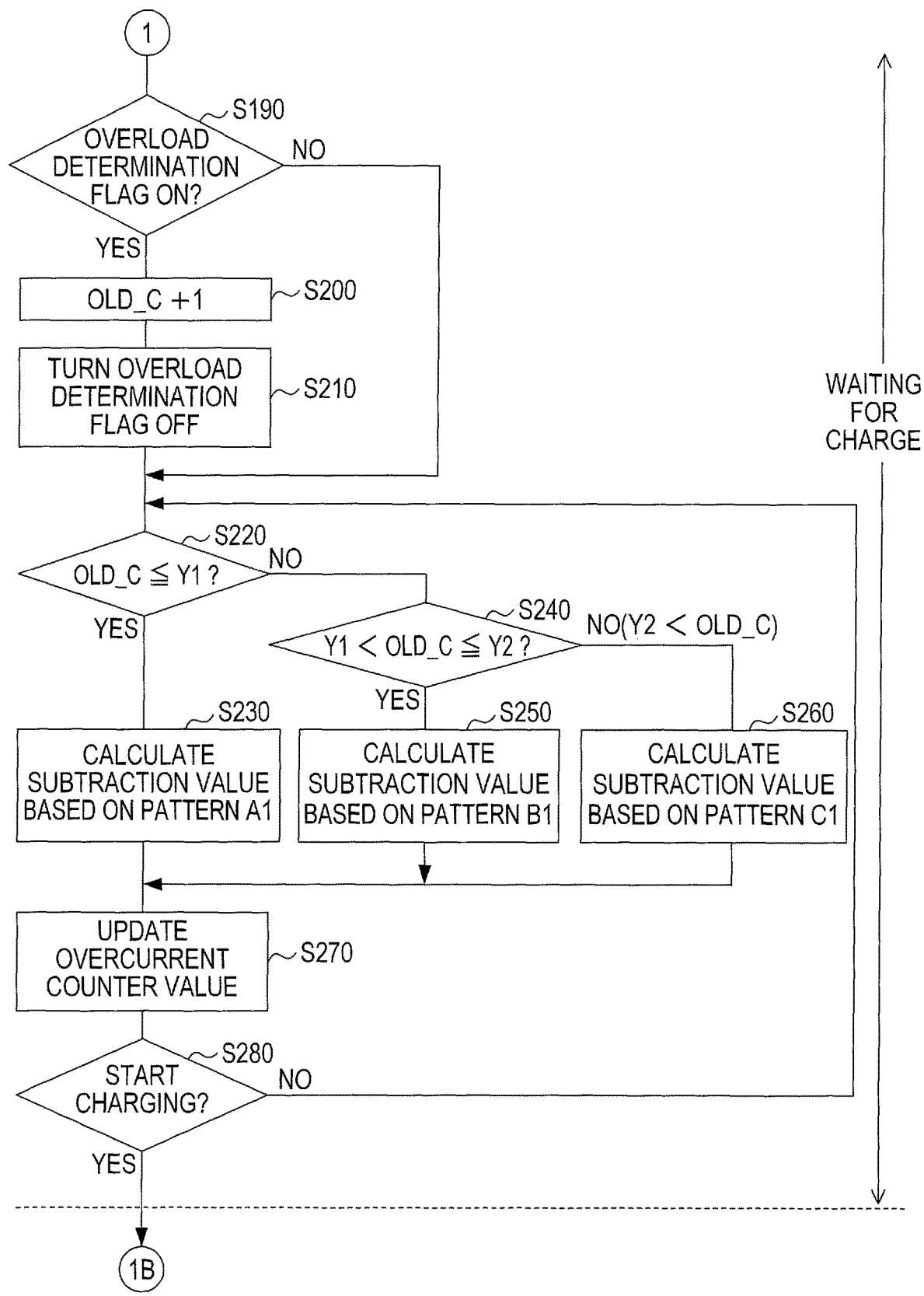
FIG. 4C is still another part of the flowchart showing the discharge prohibition determination process in accordance with the overcurrent according to the first embodiment.
Figure 4D:
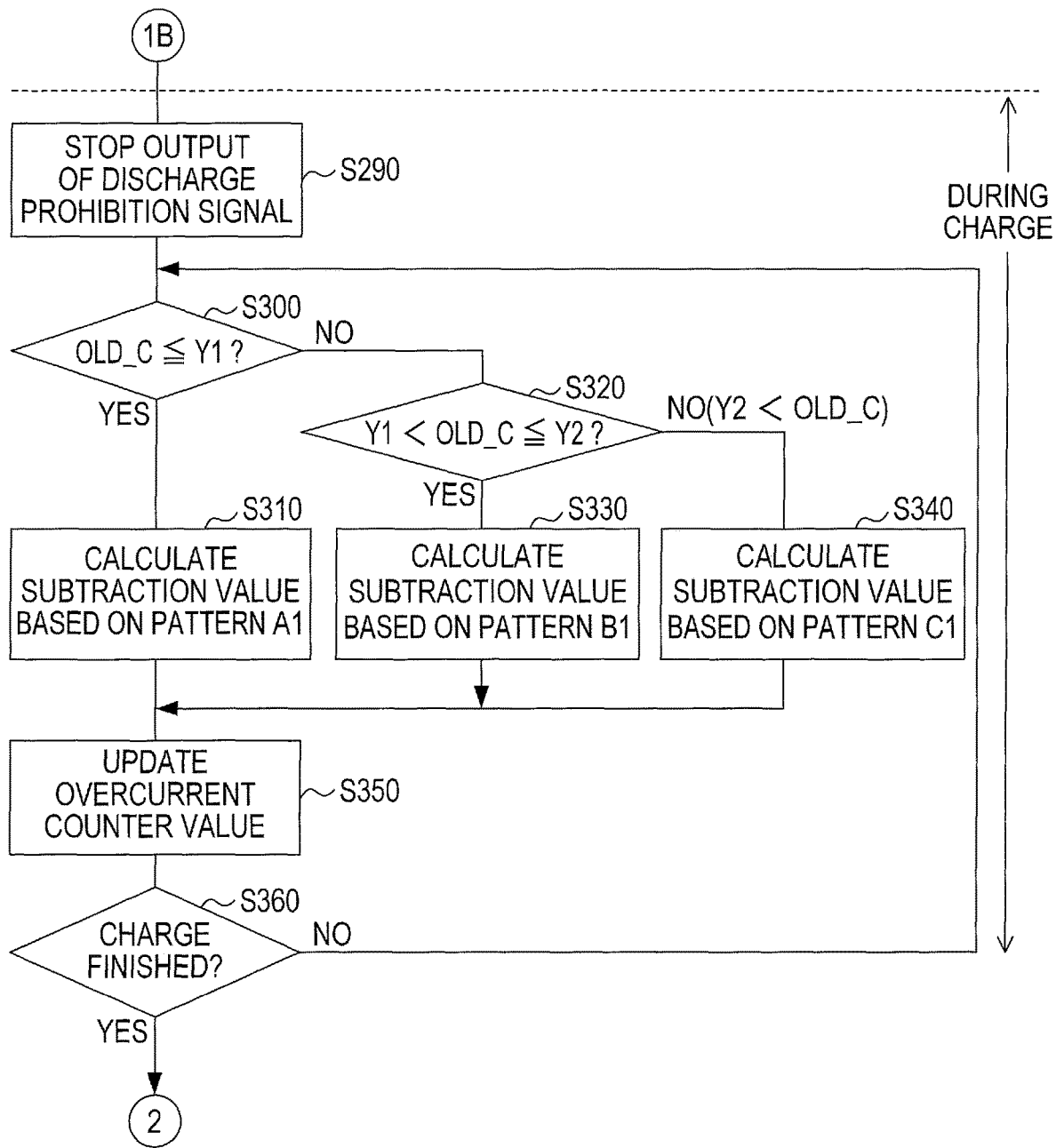
FIG. 4D is a remaining part of the flowchart showing the discharge prohibition determination process in accordance with the overcurrent according to the first embodiment.

Next, an electrical configuration of the battery pack 40 and the charger 80 will be described with reference to FIG. 3. The charger 80 includes a rectifier circuit 92, a first power-supply circuit 94, a second power-supply circuit 98, a MCU 96, a charger positive-electrode terminal 84A, a charger negative-electrode terminal 84B, and charger signal terminals 86C, 86B.

The charger positive-electrode terminal 84A is connected to the positive-electrode terminal 44A, and the charger negative-electrode terminal 84B is connected to the negative-electrode terminal 44B. The charger signal terminal 86B is connected to the signal terminal 46B, and the charger signal terminal 86C is connected to the signal terminal 46C.

The rectifier circuit 92 is configured to rectify an alternating voltage supplied from an AC power source, such as a commercial power source. The voltage rectified with the rectifier circuit 92 is output to the first power-supply circuit 94 and the second power-supply circuit 98.

The first power-supply circuit 94 is a switching circuit for charging the battery 50 in accordance with the output from the rectifier circuit 92. The MCU 96 controls the driving of the power-supply circuit 94.

The MCU 96 includes a CPU and a memory similarly to the MCU 70 in the battery pack 40, and is connected to the charger signal terminal 86B. The MCU 96 retrieves a battery state from the MCU 70 of the battery pack 40 via the charger signal terminal 86B. Then, the MCU 96 controls the driving of the first the power-supply circuit 94 in accordance with the retrieved battery state.

The second power-supply circuit 98 generates a power-supply voltage Vee (for example, direct-current 5V) for operating the internal circuits, such as the MCU 96.

The charger 80 includes a ground connected to a negative electrode of the battery 50 via the charger negative-electrode terminal 84B and the negative-electrode terminal 44B. The first power-supply circuit 94 generates a charging voltage and applies the same to a positive electrode of the battery 50 via the charger positive-electrode terminal 84A and the positive-electrode terminal 44A.

The second power-supply circuit 98 generates a power-supply voltage Vee and applies the same to the charger signal terminal 86C.

Thus, when the battery pack 40 is attached to the charger 80 and the second power-supply circuit 98 generates the power-supply voltage Vee, a high-level signal is input to the charger detection circuit 72 via the signal terminal 46C. This high-level signal corresponds to the power-supply voltage Vee. Thus, a signal level of the detection signal input from the charger detection circuit 72 to the MCU 70 is changed from a high-level to a low-level. In response to the input signal from the charger detection circuit 72 being changed to a low-level signal, the MCU 70 detects that the charger 80 is connected and wakes up from the sleep state.

[1-2. Process]

[1-2-1. Discharge Prohibition Determination Process in Accordance with Overcurrent]

Next, a discharge prohibition determination process in accordance with overcurrent, which is executed by the MCU 70 of the battery pack 40, will be described with reference to the flowchart of FIGS. 4A, 4B, 4C, and 4D. Upon waking up in response to the electric power tool 10 or the charger 80 being connected to the battery pack 40, the MCU 70 starts executing the discharge prohibition determination process. The MCU 70 is provided with a history counter OLD_C value and an overcurrent counter value.

In S10, the MCU 70 determines which is connected to the battery pack 40, the electric power tool 10 or the charger 80. In S10, if the MCU 70 determines that the electric power tool 10 is connected, the process proceeds to S20.

In S20, the MCU 70 reads a detection signal of a discharge current detected by the electric current measurement circuit 62.

Then, in S30, the MCU 70 reads a history counter OLD_C value from the memory 70b and determines whether the history counter OLD_C value is equal to or less than a setting value Y1. The history counter OLD_C value indicates the total number of use of the battery pack 40 under a specified condition. The history counter OLD_C value is increased when a discharge state of the battery 50 satisfies a specified condition. In the present embodiment, the history counter OLD_C value is increased when the battery 50 is used in an overload state. If the history counter OLD_C value is large, it indicates that the accumulated damage of the battery 50 is large. The initial value of the history counter OLD_C value is zero.

In S30, if the MCU 70 determines that the history counter OLD_C value is equal to or less than the setting value Y1, the process proceeds to S40.

In S40, an addition value is calculated in accordance with the total number of use of the battery pack 40, and more specifically, calculated using a counter-map of a pattern A1 and added to the overcurrent counter value. The overcurrent counter value indicates a loaded state of the battery 50 and used to determine whether the battery 50 is dischargeable, and to determine whether the history counter OLD_C value should be increased. The initial value of overcurrent counter is zero.

Figure 6:
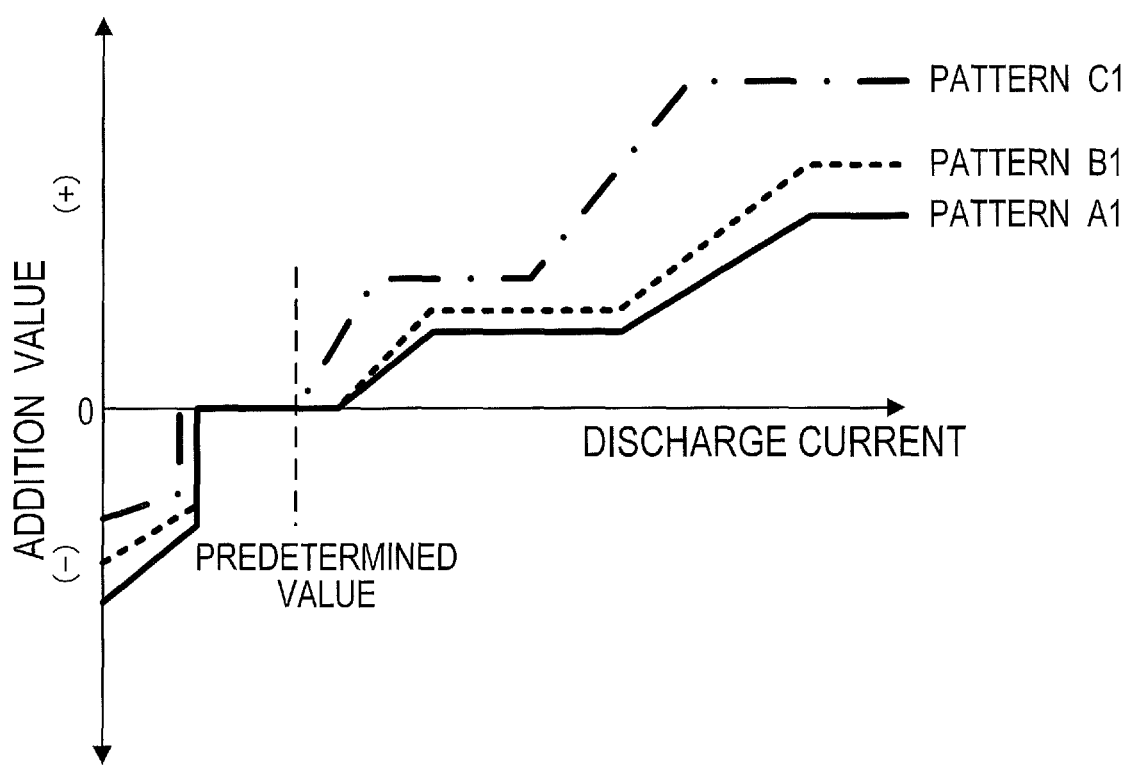
FIG. 6 is a graph showing three types of maps of addition values relative to a discharge current according to the first embodiment.

FIG. 6 shows one example of the counter-map. The counter-map of the pattern A1 is used when the accumulated damage of the battery 50 is the smallest among three levels. With the counter-map of the pattern A1, the MCU 70 calculates an addition value of zero or more when the discharge current value is equal to or more than a specified value, and calculates addition value of zero or less when the discharge current value is less than the specified value. In response to the discharge current value increasing, the addition value increase.

On the other hand, in S30, if the MCU 70 determines that the history counter OLD_C value is more than the setting value Y1, the process proceeds to S50.

In S50, the MCU 70 determines whether the history counter OLD_C value is more than the setting value Y1 and equal to or less than a setting value Y2. The setting value Y2 is larger than the setting value Y1. In S50, if the MCU 70 determines that the history counter OLD_C value is (i) more than the setting value Y1 and (ii) equal to or less than the setting value Y2, the process proceeds to S60.

In S60, the MCU 70 calculates an addition value by use of a counter-map of a pattern B1. The counter-map of pattern B1 is used when the accumulated damage of the battery 50 is medium among the three levels. With the counter pattern B1, the MCU 70 calculates addition value larger than that obtained with the counter pattern A1.

On the other hand, in S50, if the MCU 70 determines that the history counter OLD_C value is larger than the setting value Y2, the process proceeds to S70.

In S70, an addition value is calculated by use of a counter-map of a pattern C1. The counter-map of the pattern C1 is used when the accumulated damage of the battery 50 is the largest among the three levels. With the counter pattern C1, the MCU 70 calculates the addition value larger than that obtained with the counter pattern B1. That is, the MCU 70 calculates the addition value so that the addition value increases in response to the history counter OLD_C increasing.

In S80, the MCU 70 updates an overcurrent counter value. More specifically, the MCU 70 reads a current overcurrent counter value from the memory 70b and adds an addition value to the overcurrent counter to update it. The addition value here is the one calculated in S40, S60, or S70.

In S90, the MCU 70 determines whether the overcurrent counter value is equal to or more than an overload threshold X1. The overload threshold X1 is a threshold to determine whether the battery 50 is in an overload state. The overload state corresponds to a loaded state where it is not necessary to prohibit the discharge of the battery 50 but damage has been accumulated in the battery 50.

In S90, if the MCU 70 determines that the overcurrent counter value is equal to or more than the overload threshold X1, the process proceeds to S100. If the MCU 70 determines that the overcurrent counter value is less than the overload threshold X1, the process proceeds to S120.

In S100, the MCU 70 reads an overload determination flag from the memory 70b, and determines whether the read overload determination flag is OFF. In S100, if the MCU 70 determines that the overload determination flag is OFF, the process proceeds to S110. If the MCU 70 determines that the overload determination flag is ON, the process proceeds to S120. The initial state of the overload determination flag is OFF.

In S110, the MCU 70 changes the overload determination flag from OFF to ON.

In S120, the MCU 70 determines whether the overcurrent counter value is equal to or more than a protection threshold X2. The protection threshold X2 is a threshold to determine the battery 50 is in an over-discharge state. The overload threshold X1 is smaller than the protection threshold X2.

In S120, if the MCU 70 determines that the overcurrent counter value is equal to or more than the protection threshold X2, the process proceeds to S130. If the MCU 70 determines that the overcurrent counter value is less than the protection threshold X2, the process proceeds to S140.

In S130, the MCU 70 outputs a discharge prohibition signal.

Then in S140, the MCU 70 determines whether the discharge prohibition signal is output. In S140, if the MCU 70 determines that the discharge prohibition signal is not output, the process proceeds to S180. If the MCU 70 determines that the discharge prohibition signal is output, the process proceeds to S150.

In S150, the MCU 70 determines whether a battery temperature measured by the temperature measurement circuit 66 is equal to or less than a battery temperature threshold. In S150, if the MCU 70 determines that the battery temperature is higher than the battery temperature threshold, the process proceeds to S180. If the MCU 70 determines that the battery temperature is equal to or lower than the battery temperature threshold, the process proceeds to S160.

In S160, the MCU 70 determines whether the overcurrent counter value is zero. In S160, if the MCU 70 determines that the overcurrent counter value is more than zero, the process proceeds to S180. If the MCU 70 determines that the overcurrent counter value is zero, the process proceeds to S170.

In S170, the MCU 70 stops the output of the discharge prohibition signal. That is, in response to (i) the battery temperature being sufficiently low, and (ii) the overcurrent counter value decreasing, the MCU 70 determines that the battery 50 recovers from the over-discharge state to stop the output of the discharge prohibition signal.

Then, in S180, the MCU 70 determines whether the electric power tool 10 is connected to the battery pack 40. If the MCU 70 determines that the electric power tool 10 is connected to the battery pack 40, the process returns to S20. If determining that the electric power tool 10 is not connected to the battery pack 40, that is, the battery pack 40 is removed from the electric power tool 10, the MCU 70 stores the overcurrent counter value, the history counter OLD_C value, and the state of the overload determination flag in the memory 70b, and the process ends.

In S10, if the MCU 70 determines that the charger 80 is connected, the process proceeds to S190.

In S190, the MCU 70 determines whether the overload determination flag is ON. If the MCU 70 determines that the overload determination flag is ON, the process proceeds to S200. If the MCU 70 determines that the overload determination flag is OFF, the process proceeds to S220.

In S200, the MCU 70 increases the history counter OLD_C value by "1". That is, if the battery 50 has been overloaded during discharge between last charge and this charge, the MCU 70 updates the history counter OLD_C value during this charge. With this configuration, the history counter OLD_C value corresponds to the number of operations of the battery 50 while overloaded. In this way, updating the history counter OLD_C value during the charge instead of during the discharge makes the discharge prohibition determination process easier.

Then, in S210, the MCU 70 turns the overload determination flag OFF.

Then, in S220 to S270, processing similar to those in S30 to S80 are executed. However, in S230, S250, and S260, the MCU 70 calculates a subtraction value less than zero instead of the addition value. For example, in S230, S250, and S260, the MCU 70 uses the counter-map of a pattern A1 (S230), B1 (S250), and C1 (S260) and calculates the subtraction value, which is the addition value less than zero when the discharge current value is zero. Here again, the MCU 70 calculates the subtraction value so that the subtraction value increases in response to the history counter OLD_C value increasing. That is, the MCU 70 calculates the subtraction value so that the absolute value of the subtraction value decreases in response to the history counter OLD_C value increasing.

Then, in S280, the MCU 70 determines whether to start charging. If the MCU 70 determines not to start charging, the process returns to S220. If the MCU 70 determines to start charging, the process proceeds to S290.

In S290, the MCU 70 stops the output of the discharge prohibition signal.

In S300 to S350, the MCU 70 executes processing similar to those in S220 to S270.

Then in S360, the MCU 70 determines whether the charge is finished. If the MCU 70 determines that the charge is not finished, the process returns to S300. If determining that the charge is finished, the MCU 70 stores the overcurrent counter value, the history counter OLD_C value, and the state of the overload determination flag in the memory 70b, and the process ends.

Figure 7:
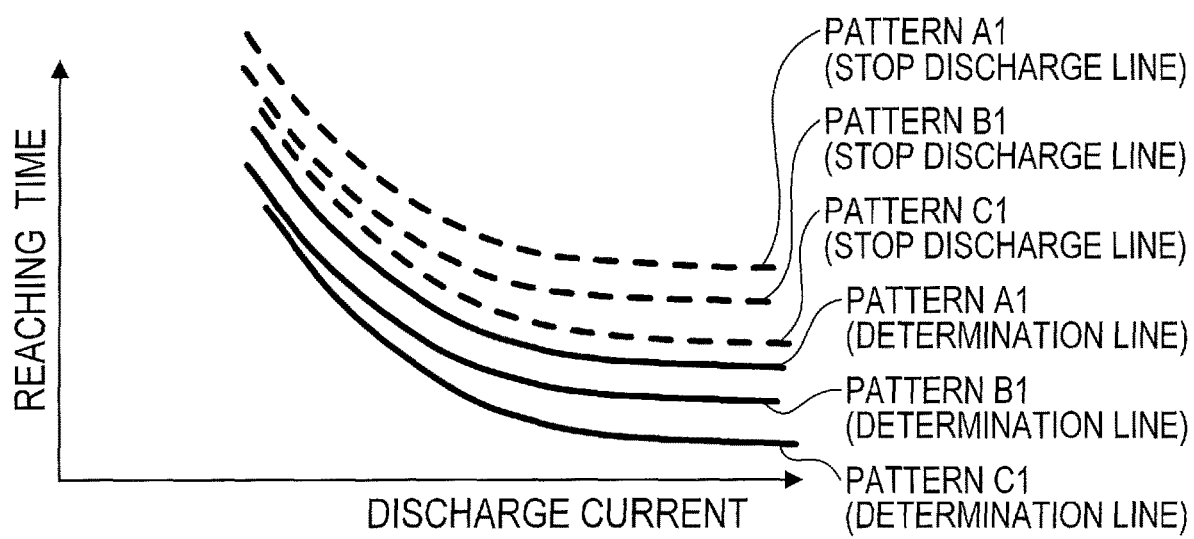
FIG. 7 is a graph showing the reaching time to determine an over-discharge state and the reaching time to stop discharge relative to the discharge current when the three maps shown in FIG. 6 are used.
Figure 8A:
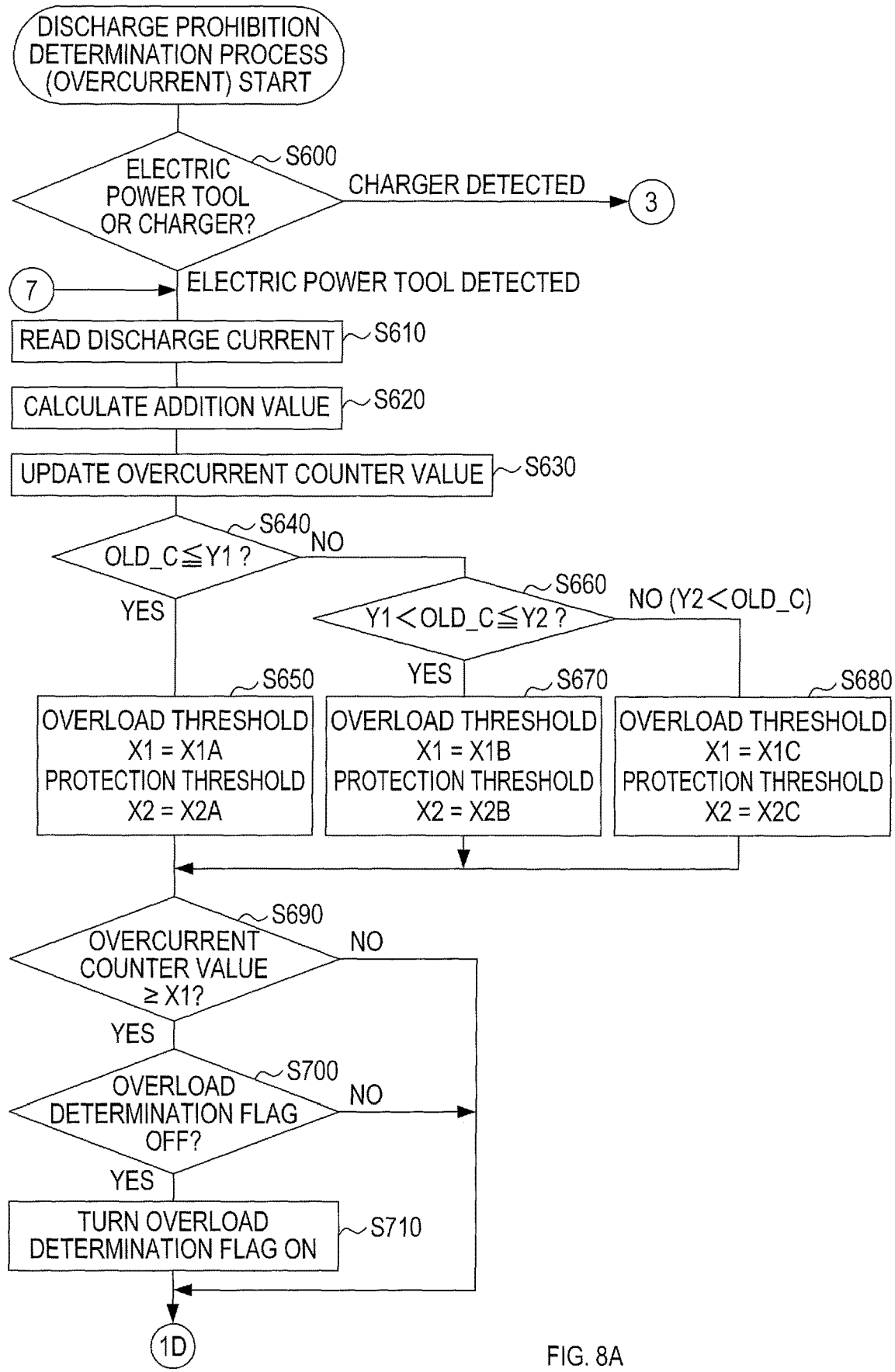
FIG. 8A is a part of a flowchart showing a discharge prohibition determination process in accordance with an overcurrent according to a second embodiment.
Figure 8B:
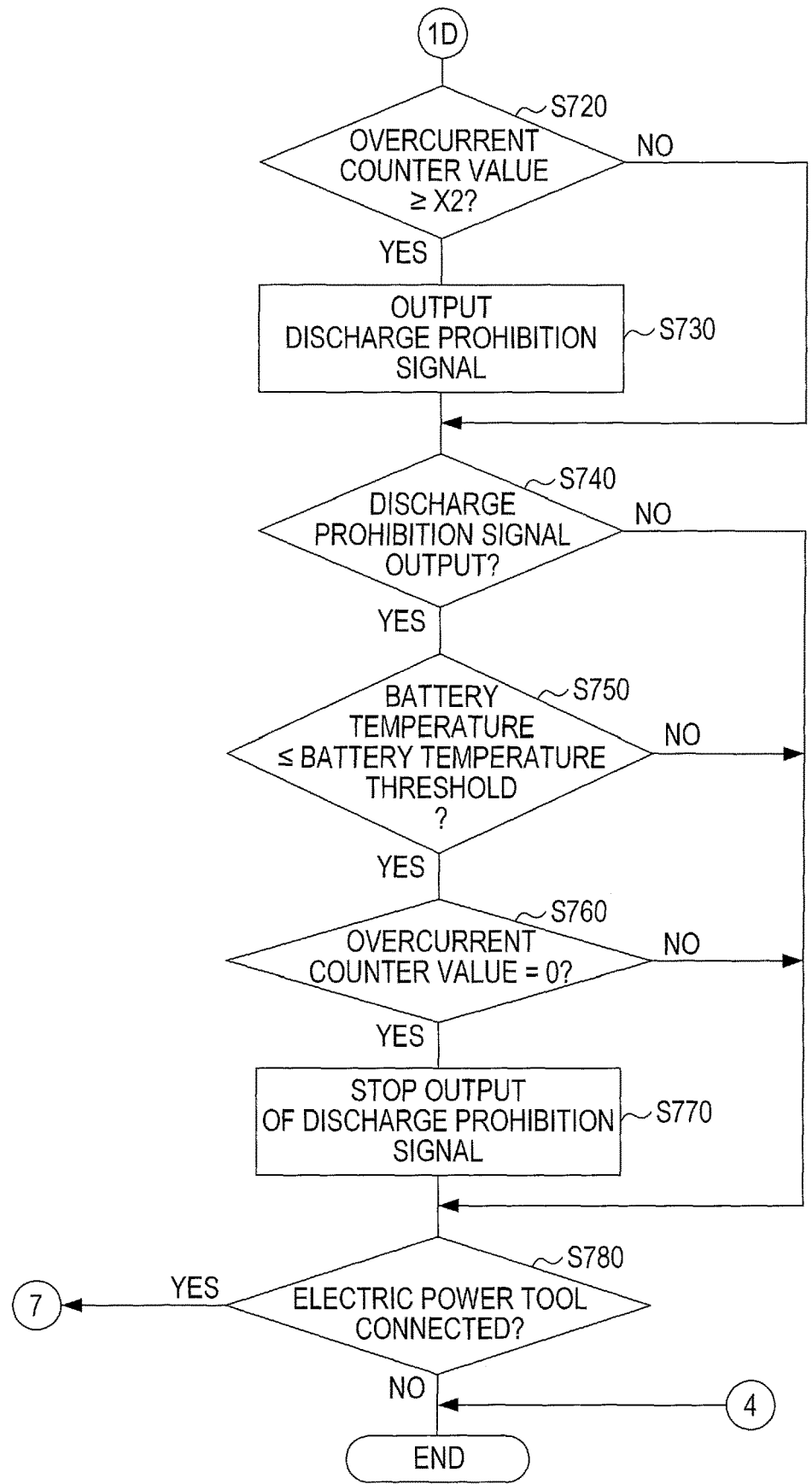
FIG. 8B is another part of the flowchart showing the discharge prohibition determination process in accordance with the overcurrent according to the second embodiment.
Figure 8C:
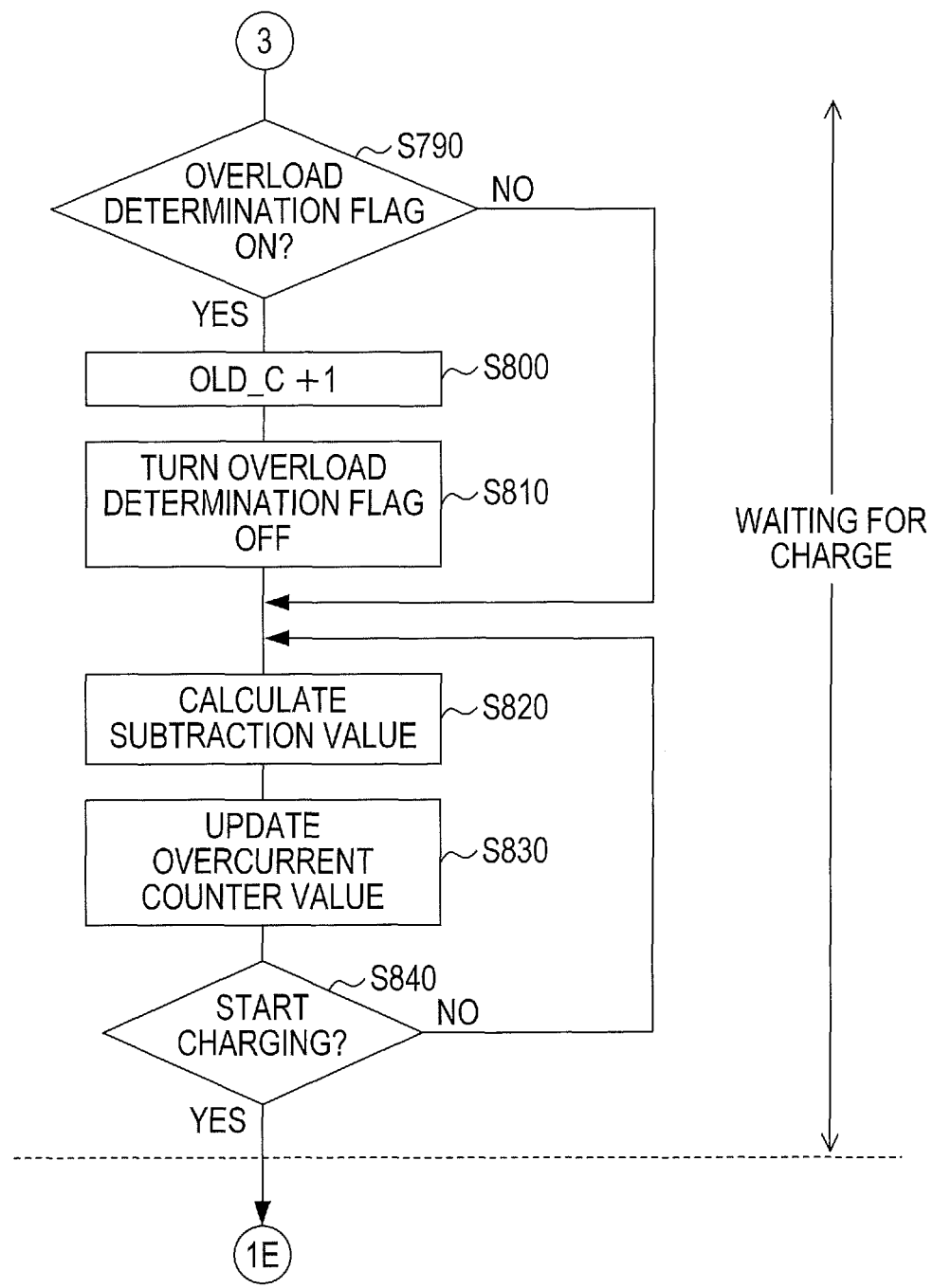
FIG. 8C is still another part of the flowchart showing the discharge prohibition determination process in accordance with the overcurrent according to the second embodiment.
Figure 8D:
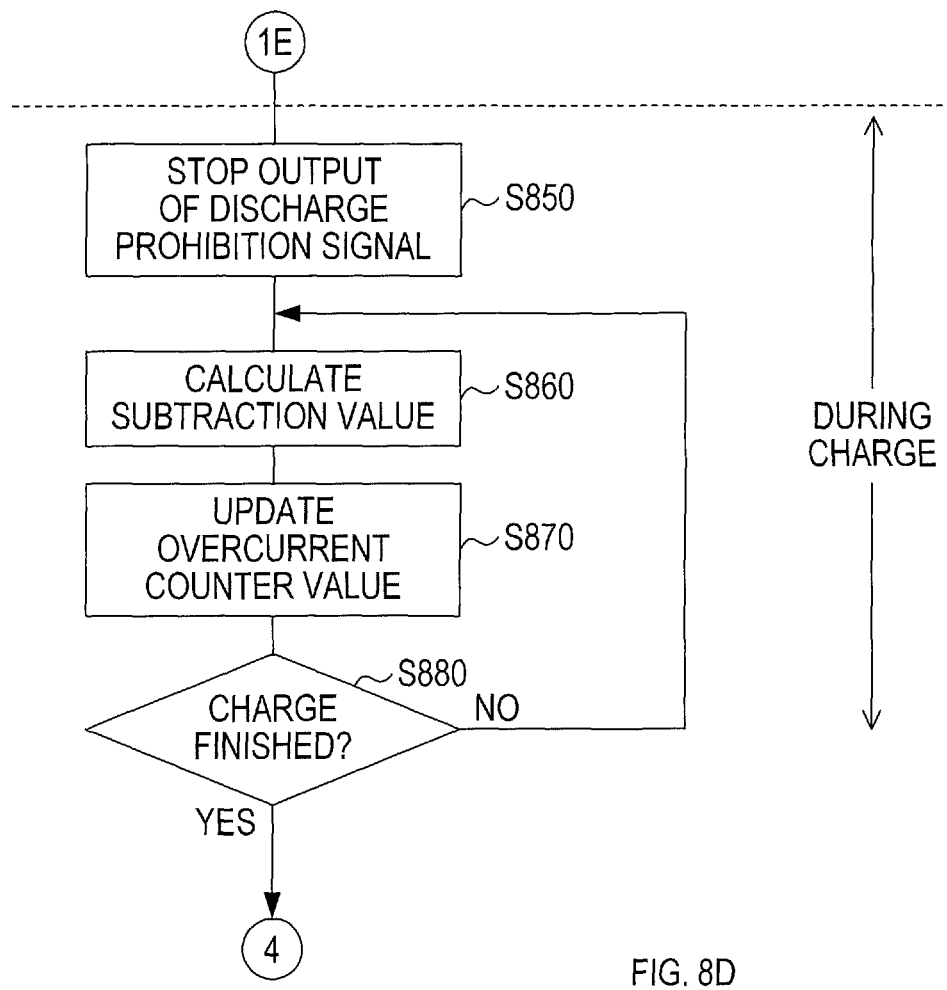
FIG. 8D is a remaining part of the flowchart showing the discharge prohibition determination process in accordance with the overcurrent according to the second embodiment.

FIG. 7 shows the reaching time to determine the overloaded state and the reaching time to stop the discharge when the counter-maps of the pattern A1, B1, and C1 are used in the discharge prohibition determination process in accordance with the overcurrent according to the first embodiment. As shown in FIG. 7, the reaching time to determine the overloaded state and the reaching time to stop the discharge are shorter with the pattern B1 than those with the pattern A1 in the same discharge current value. Similarly, the reaching time to determine the overloaded state and the reaching time to stop the discharge with the pattern C1 are shorter than those with pattern B1 in the same discharge current value. That means in response to the accumulated damage of the battery 50 increasing, the MCU 70 promptly determines the overloaded state and the history counter OLD_C value is easily increased, whereby the battery pack 40 is promptly protected.

[1-2-2. Discharge Prohibition Determination Process in Accordance with Temperature]

Figure 5A:
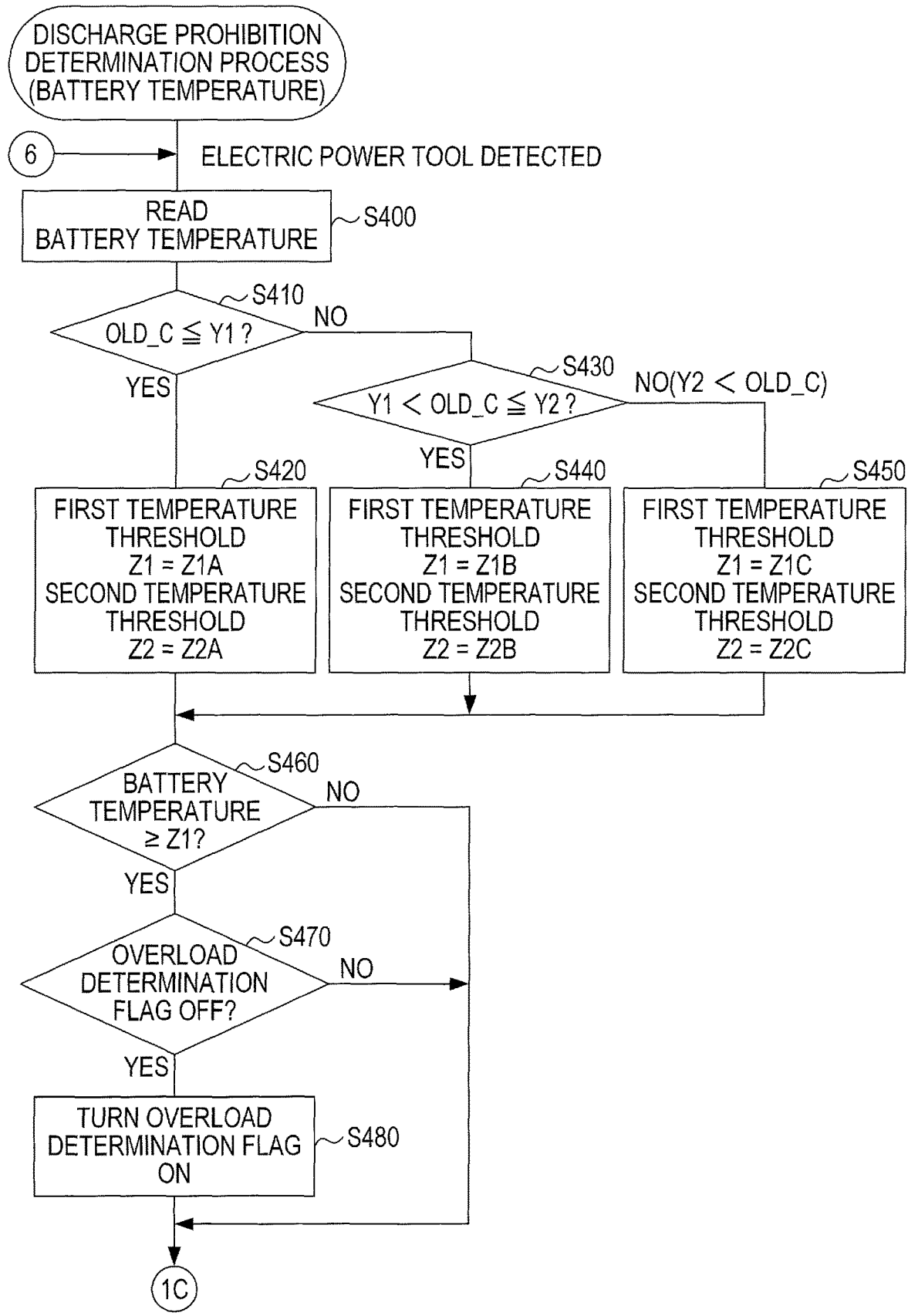
FIG. 5A is a part of a flowchart showing a discharge prohibition determination process in accordance with temperature according to the first embodiment.
Figure 5B:
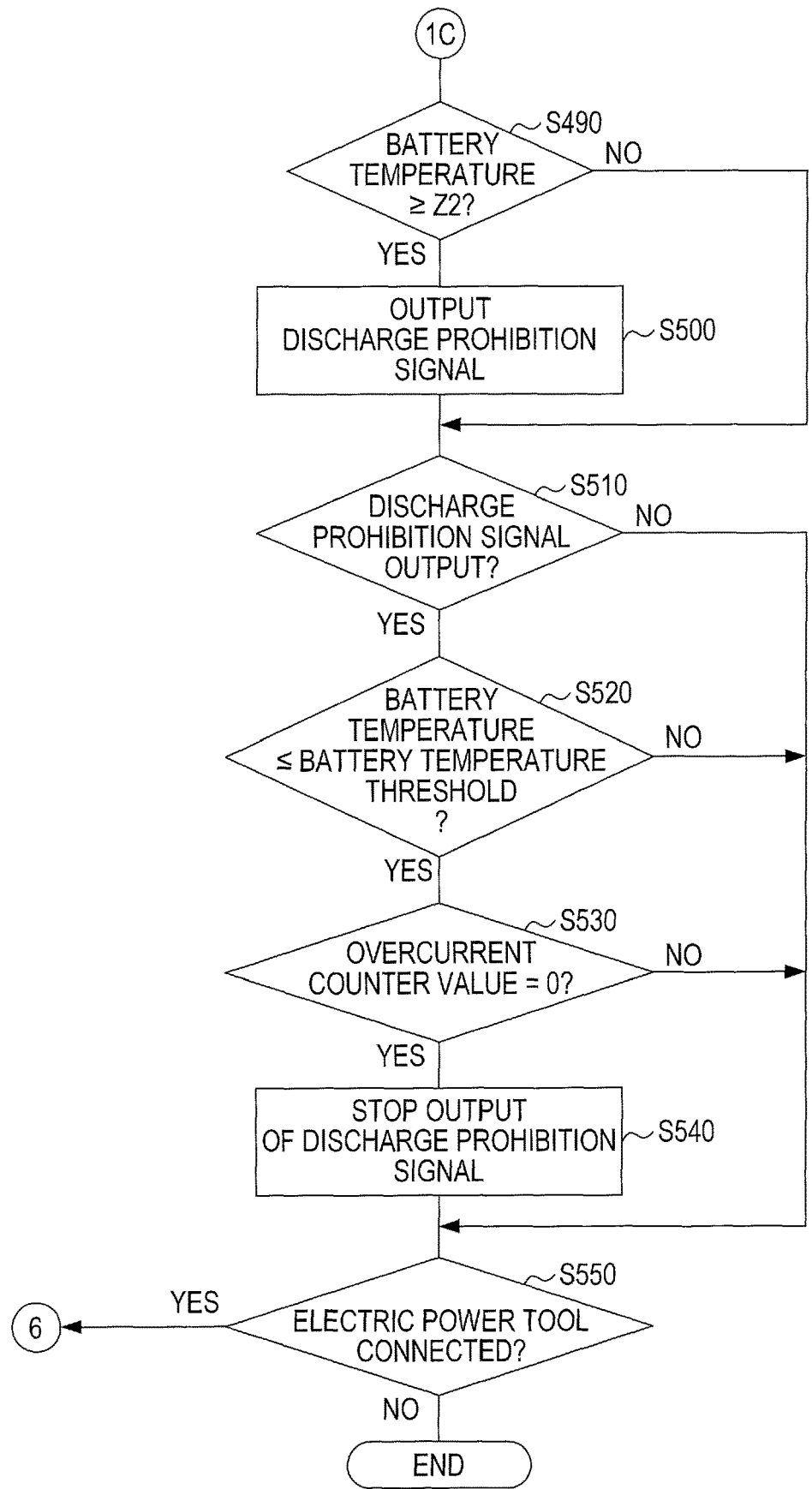
FIG. 5B is a remaining part of the flowchart showing the discharge prohibition determination process in accordance with the temperature according to the first embodiment.

Next, a discharge prohibition determination process in accordance with a temperature of the battery, which is executed by the MCU 70 of the battery pack 40 will be described with reference to the flowchart of FIGS. 5A and 5B. If detecting that the electric power tool 10 is connected to the battery pack 40, the MCU 70 executes this process concurrently with the process of the flowchart shown in FIG. 4A to 4D.

First, in S400, the MCU 70 reads a temperature of the battery measured by the temperature measurement circuit 66.

Then, in S410, the MCU 70 determines whether the history counter OLD_C value is equal to or less than the setting value Y1. If the MCU 70 determines that the history counter OLD_C value is equal to or less than the setting value Y1 or less, the process proceeds to S420.

In S420, the MCU 70 sets a first setting value Z1a of the pattern A1 to a first temperature threshold Z1, and sets a second setting value Z2a of the pattern A1 to a second temperature threshold Z2. The first temperature threshold Z1 is a threshold to determine the battery 50 is in the overload state in which the battery can be damaged. The second temperature threshold Z2 is a threshold to determine the battery 50 is within a usable temperature. The first temperature threshold Z1 is smaller than the second temperature threshold Z2.

If the MCU 70 determines that the history counter OLD_C value is more than the setting value Y1, the process proceeds to S430.

In S430, the MCU 70 determines whether the history counter OLD_C value is (i) more than the setting value Y1 and (ii) equal to or less than the setting value Y2. If the MCU 70 determines that the history counter OLD_C value is (i) more than the setting value Y1 and (ii) equal to or less than the setting value Y2, the process proceeds to S440.

In S440, the MCU 70 sets a first setting value Z1b of the pattern B1 to the first temperature threshold Z1, and sets a second setting value Z2b of the pattern B1 to the second temperature threshold Z2. The first setting value Z1a is larger than the first setting value Z1b, and the second setting value Z2a is larger than the second setting value Z2b.

In S430, if the MCU 70 determines that the history counter OLD_C value is more than the setting value Y2, the process proceeds to S450.

In S450, the MCU 70 sets a first setting value Z1c of the pattern C1 to the first temperature threshold Z1, and sets a second setting value Z2c of the pattern C1 to the second temperature threshold Z2. The first setting value Z1b is larger than the first setting value Z1c, and the second setting value Z2b is larger than the second setting value Z2c.

Then, in S460, the MCU 70 determines whether the battery temperature is equal to or higher than the first temperature threshold Z1. If the MCU 70 determines that the temperature of the battery is equal to or higher than the first temperature threshold Z1, the process proceeds to S470. If the MCU 70 determines that the battery temperature is lower than the first temperature threshold Z1, the process proceeds to S490.

In S470 and 5480, the MCU 70 executes processing similar to those in S100 and S110.

Then, in S490, the MCU 70 determines whether the battery temperature is equal to or higher than the second temperature threshold Z2. If the MCU 70 determines that the battery temperature is equal to or higher than the second temperature threshold Z2, the process proceeds to S500. If the MCU 70 determines that the battery temperature is lower than the second temperature threshold Z2, the process proceeds to S510.

Then in S500 to S550, the MCU 70 executes processing similar to those in S130 to S180.

With execution of the discharge prohibition process in accordance with the battery temperature according to the first embodiment, in response to the history counter OLD_C value increasing, in other words, in response to the accumulated damage of the battery 50 increasing, the battery temperature rapidly reaches the first temperature threshold Z1 and the history counter OLD_C value easily increases. In addition, in response to the history counter OLD_C value increasing, the battery temperature rapidly reaches the second temperature threshold Z2, whereby the battery 50 can be promptly protected.

[1-3. Effect]

According to the above-described first embodiment, the following effects can be achieved.

(1) The addition value is calculated in accordance with the history counter OLD_C value. The calculated addition value is added to the overcurrent counter to update the overcurrent counter value. When the overcurrent counter value reaches the protection threshold X2, the discharge of the battery 50 is prohibited. Therefore, the reaching time that the overcurrent counter value reaches the protection threshold X2 varies in accordance with the total number of use of the battery pack 40 under a specified condition, and thus, the battery pack 40 can be properly protected in accordance with the total number of use of the battery pack 40.

(2) The addition value is calculated so as to increase in response to the history counter OLD_C value increasing. Thus, the overcurrent counter value rapidly reaches the protection threshold X2 in response to the accumulated damage of the battery 50 increasing. Therefore, the battery pack 40 can be properly protected in accordance with the total number of use.

(3) When the discharge current value is equal to or more than the specified value, the addition value of zero or more is calculated. When the discharge current value is less than the specified value, the addition value of zero or less is calculated. Thus, when the discharge current value is equal to or more than the specified value, the overcurrent counter value rapidly increases in response to the accumulated damage of the battery 50 increasing. When the discharge current value is less than the specified value, the overcurrent counter value slowly decreases in response to the accumulated damage of the battery 50 increasing. Therefore, the battery pack 40 can be properly protected in accordance with the total number of use.

(4) The number of operations of the battery pack 40 having the overcurrent counter value exceeding the overload threshold X1 is used to protect the battery pack 40. This allows to protect the battery pack 40 in accordance with the accumulated damage in the battery 50.

(5) The number of operations of the battery pack 40 having the battery temperature exceeding the first temperature threshold Z1 is used to protect the battery pack 40. This allows to protect the battery pack 40 in accordance with the accumulated damage in the battery 50.

(6) During the charge of the battery 50, the subtraction value of less than zero is calculated, and added to the overcurrent counter value to update it. The overcurrent counter value is updated even during the charge, and thus properly indicates the state of the battery 50.

(7) Also during the charge, the overcurrent counter value slowly decreases in response to the accumulated damage of the battery 50 increasing. Therefore, the battery pack 40 can be properly protected in accordance with the total number of use.

(8) When the overload determination flag is set to ON during the discharge of the battery 50, the MCU 70 is to increase the history counter OLD_C value during a next charge. This makes the discharge prohibition determination process easier than the case where the history counter OLD_C value is increased during the discharge. Therefore, the processing load of the MCU 70 can be reduced.

(9) The first temperature threshold Z1 is set so as to decrease in response to the history counter OLD_C value increasing. This makes the battery temperature quickly reach the first temperature threshold Z1 in response to the accumulated damage of the battery 50 increasing, and thus, the history counter OLD_C value is easily increased. Similarly, the second temperature threshold Z2 is set so as to decrease in response to the history counter OLD_C value increasing. This makes the battery temperature quickly reach the second temperature threshold Z2 in response to the accumulated damage of the battery 50 increasing, and thus, the battery pack 40 can be promptly protected. Therefore, the battery pack 40 can be properly protected in accordance with the total number of use.

Second Embodiment

[2-1. Difference from First Embodiment]

Since the basic configuration of a second embodiment is similar to that of the first embodiment, explanations of the common configuration are omitted and differences will be mainly explained. Please note that the same reference numerals as those of the first embodiment indicate the same components, and the reference is made to the preceding description.

In the above-described first embodiment, in the discharge prohibition determination process in accordance with the overcurrent, different counter-maps are used depending on the history counter OLD_C value, and the addition value is calculated so as to increase in response to the history counter OLD_C value increasing. On the other hand, in the second embodiment, the same counter-map is used regardless of the history counter OLD_C value, and the overload threshold X1 and the protection threshold X2 vary depending on the history counter OLD_C value. In this point, the second embodiment is different from the first embodiment.

[2-2. Process]

[2-2-1. Discharge Determination Process in Accordance with Overcurrent]

Next, a discharge prohibition determination process in accordance with the overcurrent, which is executed by the MCU 70 of the battery pack 40, will be described with reference to the flowchart of FIGS. 8A, 8B, 8C, 8D. When the electric power tool 10 or the charger 80 is connected to the battery pack 40, the MCU 70 wakes up and starts the execution of the discharge prohibition determination process. The MCU 70 is provided with the history counter OLD_C value and the overcurrent counter value. If detecting that the electric power tool 10 is connected to the battery pack 40, the MCU 70 executes this process concurrently with the process of the flowchart shown in FIG. 5.

First, in S600 and S610, the MCU 70 executes processing similar to those of S10 and S20.

Then, in S620, the MCU 70 calculates an addition value using a counter-map. For example, the MCU 70 calculates the addition value using the counter-map of the pattern B1 shown in FIG. 6. In this embodiment, the same counter-map is used regardless of the history counter OLD_C value.

Then, in S630, the MCU 70 executes processing similar to that of S80.

Then, in S640, the MCU 70 determines whether the history counter OLD_C value is equal to or less than the setting value Y1. If the MCU 70 determines that the history counter OLD_C value is equal to or less than the setting value Y1, the process proceeds to S650.

In S650, the MCU 70 sets a first setting value X1$a$ of the pattern A1 to the overload threshold X1, and sets a second setting value X2$a$ of the pattern A1 to the protection threshold X2. The overload threshold X1 is smaller than the protection threshold X2.

If the MCU 70 determines that the history counter OLD_C value is more than the setting value Y1, the process proceeds to S660.

In S660, the MCU 70 determines whether the history counter OLD_C value is (i) more than the setting value Y1 and (ii) equal to or less than the setting value Y2. If the MCU 70 determines that the history counter OLD_C value is (i) more than the setting value Y1 and (ii) equal to or less than the setting value Y2, the process proceeds to S670.

In S670, the MCU 70 sets a first setting value X1$b$ of the pattern B1 to the overload threshold X1, and sets a second setting value X2$b$ of the pattern B1 to the protection threshold X2. The first setting value X1$a$ is larger than the first setting value X1$b$, and the second setting value X2$a$ is larger than the second setting value X2$b$.

In S660, if the MCU 70 determines that the history counter OLD_C value is more than the setting value Y2, the process proceeds to S680.

In S680, the MCU 70 sets a first setting value X1c of the pattern C1 to the overload threshold X1, and sets a second setting value X2c of the pattern C1 to the protection threshold X2. The first setting value X1b is larger than the first setting value X1c, and the second setting value X2b is larger than the second setting value X2c.

Then, in S690 to S780, the MCU 70 executes processing similar to those in S90 to S180.

In S600, if the MCU 70 determines that the charger 80 is connected, the process proceeds to S790.

In S790 to 5810, the MCU 70 executes processing similar to those in S190 to S210.

Then, in S820, the MCU 70 calculates a subtraction value. For example, the MCU 70 calculates the subtraction value, which is the addition value less than zero when the discharge current value is zero. Here again, the same counter-map is used regardless of the history counter OLD_C value. Alternatively, a specified subtraction value may be used.

In S830 to S850, the MCU 70 executes processing similar to S270 to S290.

In S860, the MCU 70 calculates subtraction value similarly to S820.

In S870 and S880, the MCU 70 executes processing similar to those in S350 and S360.

By executing the discharge prohibition process in accordance with the overcurrent according to the second embodiment, the overcurrent counter value rapidly reaches the overload threshold X1 in response to the history counter OLD_C value increasing, in other words, in response to the accumulated damage the battery 50 increasing, whereby the history counter OLD_C can be easily increased. In addition, the overcurrent counter value rapidly reaches the protection threshold X2 in response to the history counter OLD_C value increasing, whereby the battery pack 40 can be promptly protected.

[2-3. Effect]

According to the above-described second embodiment, the following effects can be achieved besides the above-described effects (4) to (6), (8), and (9) of the first embodiment.

(10) The protection threshold X2 is set so as to decrease in response to the history counter OLD_C value increasing. Thus, the overcurrent counter value rapidly reaches the protection threshold X2 in response to the accumulated damage of the battery 50 increasing, whereby the discharge of the battery 50 is prohibited. Therefore, the battery pack 40 can be properly protected in accordance with the total number of use.

(11) The overload threshold X1 is set so as to decrease in response to the history counter OLD_C value increasing. Thus, the overcurrent counter value rapidly reaches the overload threshold X1 in response to the accumulated damage of the battery 50 increasing. The increase rate of the history counter OLD_C value can be increased in response to the history counter OLD_C value increasing, whereby the battery pack 40 can be protected more promptly.

Other Embodiment

Although some example embodiments to implement the present disclosure have been described, the present disclosure is not limited to the above-described embodiments, but may be implemented in various forms.

(a) In the second embodiment, the flowchart of FIGS. 8A, 8B, 8C, 8D are executed instead of the flowchart of FIGS. 4A, 4B, 4C, 4D of the first embodiment; however, they may be concurrently executed. That is, the flowcharts of FIGS. 4A, 4B, 4C, 4D, FIGS. 5A, 5B, and FIGS. 8A, 8B, 8C, 8D may be concurrently executed. Alternatively, only one of the three flowcharts (FIGS. 4A, 4B, 4C, 4D, FIGS. 5A, 5B, or FIGS. 8A, SB, 8C, 8D) may be executed. In executing concurrently, a first determination flag (which is turned ON in response to the overcurrent counter exceeding the overload protection threshold) and a second determination flag (which is turned ON in response to the battery temperature exceeding the temperature threshold) are integrated into one to increase the history counter OLD_C value. Alternatively, the first determination flag is separated from the second determination flag, and the history counter value in accordance with the first determination flag and the history counter value in accordance with the second determination flag may be separated.

(b) In the above-described embodiment, when the overload determination flag is set to ON, the history counter OLD_C value is increased during the charge. However, the present disclosure may not be limited to this. That is, when the overload determination flag is set to ON, the history counter OLD_C value may be increased during the discharge. In this case, every time the overcurrent counter value reaches the overload threshold X1, the history counter OLD_C value may be increased by "1" during the charge. Alternatively, when the overcurrent counter value reaches the overload threshold X1 a specified number of times, the history counter OLD_C value may be increased by "1" during the charge.

(c) Examples of the total number of use of the battery pack may include the number of operations of the battery pack 40 used in a low-temperature environment, and/or in a high-temperature environment. The "low-temperature environment" is where a surrounding temperature is lower than a proper operation range of the battery pack 40. "The high-temperature environment" is where a surrounding temperature is higher than the proper operation range of the battery pack 40. The proper operation range is pre-determined depending on the type of the battery pack 40. Another example of the total number of use of the battery pack may include the number of times that the battery 50 is prohibited from discharging. In other words, examples of the total number of use of the battery pack may include (i) the number of times that the overcurrent counter value reaches the protection threshold X2, and (ii) the number of times that the battery temperature reaches the second temperature threshold Z2.

(d) In the above-described embodiment, the subtraction value is calculated and the overcurrent counter value is updated during the charge of the battery 50. However, the overcurrent counter value may not be updated during the charge.

(e) A plurality of functions performed by a single element in the aforementioned embodiments may be achieved by a plurality of elements, or a function performed by a single element may be achieved by a plurality of elements. Also, a plurality of functions performed by a plurality of elements may be achieved by a single element, or a function performed by a plurality of elements may be achieved by a single element. Moreover, at least a part of a configuration in the aforementioned embodiments may be added to, or may replace, another configuration in the aforementioned embodiments.

What is claimed is:

1. A battery pack comprising:
a battery;
a memory storing a map A1 and a map B1, the map A1 and the map B1 each indicating a correspondence relation between a discharge current value and an addition value, the addition value in the map B1 being larger than the addition value in the map A1;

a signal terminal; and a Main Control Unit (MCU) including an overcurrent counter value and a history counter value, the MCU being configured to perform a discharge prohibition determination process, the discharge prohibition determination process including:

obtaining the discharge current value in response to an electric working machine being connected to the battery pack;

calculating the addition value corresponding to the discharge current value obtained, by using the map A1 in response to the history counter value being equal to or less than a setting value;

calculating the addition value corresponding to the discharge current value obtained, by using the map B1 in response to the history counter value being more than the setting value;

updating the overcurrent counter value by adding the addition value calculated to the overcurrent counter value;

turning ON an overload determination flag increasing the history counter value in response to the overcurrent counter value reaching an overload threshold; and outputting a discharge prohibition signal via the signal terminal in response to the overcurrent counter value reaching a protection threshold larger than the overload threshold.

2. A battery pack comprising:

a battery; and a controller provided with a counter value, the controller being configured to:

calculate an addition value during discharge of the battery in accordance with a total number of uses of the battery pack under a specified condition;

update the counter value by adding the addition value during the discharge of the battery; and prohibit the discharge of the battery during the discharge of the battery in response to the counter value reaching a protection threshold, the total number of uses including a first number of operations, the first number of operations corresponding to a total number of operations of the battery pack having the counter value exceeding an overload threshold, and the overload threshold being set to be smaller than the protection threshold.

3. The battery pack according to claim 2, wherein the controller is configured to calculate the addition value so that the addition value increases in response to the total number of uses increasing.

4. The battery pack according to claim 2, wherein the controller is configured to calculate the addition value that is zero or more in accordance with a discharge current value being equal to or more than a specified value, and wherein the controller is configured to calculate the addition value that is zero or less in accordance with the discharge current value being less than a specified value.

5. The battery pack according to claim 2, wherein the total number of uses includes a second number of operations, and wherein the second number of operations corresponds to a total number of operations of the battery pack having a temperature exceeding a specified temperature threshold.

6. The battery pack according to claim 2, wherein the controller is configured to calculate a subtraction value in accordance with the total number of uses during charge of the battery, wherein the subtraction value is less than zero, and wherein the controller is configured to update the counter value by adding the subtraction value during the charge of the battery.

7. The battery pack according to claim 6, wherein the controller is configured to calculate the subtraction value so that the subtraction value increases in response to the total number of uses increasing.

8. The battery pack according to claim 2, wherein the controller is configured to set the protection threshold during the discharge of the battery in accordance with the total number of uses.

9. The battery pack according to claim 8, wherein the controller is configured to set the protection threshold so that the protection threshold decreases in response to the total number of uses increasing.

10. The battery pack according to claim 2, wherein the controller is configured to set the overload threshold during the discharge of the battery in accordance with the total number of uses.

11. The battery pack according to claim 10, wherein the controller is configured to set the overload threshold so that the overload threshold decreases in response to the total number of uses increasing.

12. A battery pack comprising:

a battery; and a controller provided with a counter value, the controller being configured to:

calculate an addition value during discharge of the battery in accordance with a total number of uses of the battery pack under a specified condition;

update the counter value by adding the addition value during the discharge of the battery;

prohibit the discharge of the battery during the discharge of the battery in response to the counter value reaching a protection threshold; and increase the total number of uses during the charge of the battery, in response to a loaded state of the battery satisfying a specified condition between a previous charge to this charge.

13. A method of protecting a battery included in a battery pack, the method comprising:

calculating an addition value in accordance with a total number of uses of the battery during discharge of the battery, the total number of uses including a first number of operations, the first number of operations corresponding to a total number of operations of the battery pack having a counter value exceeding an overload threshold, and the overload threshold being set to be smaller than a protection threshold;

updating the counter value by adding the addition value during the discharge of the battery; and prohibiting the discharge of the battery in response to the counter value reaching the protection threshold during the discharge of the battery.

* * * * *